United States Patent
Jeong et al.

(10) Patent No.: US 12,342,528 B2
(45) Date of Patent: Jun. 24, 2025

(54) SEMICONDUCTOR DEVICE AND MANUFACTURING METHOD

(71) Applicant: SAMSUNG ELECTRONICS CO., LTD., Suwon-si (KR)

(72) Inventors: Seongjin Jeong, Seoul (KR); Seokhan Park, Seongnam-si (KR); Yejee Sunwoo, Seoul (KR); Bowon Yoo, Suwon-si (KR); Youngwoong Son, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 325 days.

(21) Appl. No.: 17/872,143

(22) Filed: Jul. 25, 2022

(65) Prior Publication Data

US 2023/0039823 A1 Feb. 9, 2023

(30) Foreign Application Priority Data

Aug. 9, 2021 (KR) .......................... 10-2021-0104899

(51) Int. Cl.
*H10B 12/00* (2023.01)

(52) U.S. Cl.
CPC ......... *H10B 12/315* (2023.02); *H10B 12/033* (2023.02); *H10B 12/09* (2023.02); *H10B 12/50* (2023.02)

(58) Field of Classification Search
CPC ....... H01L 28/90; H10B 12/50; H10B 12/315; H10B 12/09; H10B 12/033
See application file for complete search history.

(56) References Cited

U.S. PATENT DOCUMENTS

| | | |
|---|---|---|
| 6,184,077 B1 | 2/2001 | Shin et al. |
| 6,906,374 B2 | 6/2005 | Tanaka |
| 7,704,832 B2 | 4/2010 | Kai et al. |
| 7,985,645 B2 | 7/2011 | Park et al. |
| 8,877,583 B2 | 11/2014 | Kim et al. |
| 10,373,673 B2 | 8/2019 | Shin et al. |
| 11,296,099 B2 | 4/2022 | Chen et al. |

(Continued)

FOREIGN PATENT DOCUMENTS

| | | | | |
|---|---|---|---|---|
| CN | 112018069 A | * | 12/2020 | ............... H01G 4/40 |
| CN | 113130385 A | * | 7/2021 | ....... H01L 21/76816 |

(Continued)

OTHER PUBLICATIONS

Office Action in Taiwanese Appln. No. 111129741, mailed on Aug. 15, 2023, 13 pages (with English translation).

(Continued)

*Primary Examiner* — Edward Chin
(74) *Attorney, Agent, or Firm* — Fish & Richardson P.C.

(57) ABSTRACT

A semiconductor device includes; cell transistors on a substrate, lower electrodes respectively connected to the cell transistors, arranged according to a first pitch in a first horizontal direction, and extending in a vertical direction, and an etching stop layer surrounding lower sidewalls of the lower electrodes and arranged at a level higher than a level of the cell transistors, wherein the etching stop layer includes a first portion vertically overlapping the lower electrodes and a second portion laterally surrounding the first portion, and the second portion includes recesses arranged according to a second pitch in the first horizontal direction.

20 Claims, 23 Drawing Sheets

(56) References Cited

U.S. PATENT DOCUMENTS

| | | |
|---|---|---|
| 2010/0102371 A1 | 4/2010 | Yeom |
| 2016/0260635 A1 | 9/2016 | Hong et al. |
| 2018/0122898 A1 | 5/2018 | Park et al. |
| 2018/0350957 A1 | 12/2018 | Lim et al. |
| 2020/0194437 A1* | 6/2020 | Song ............... H10D 64/20 |

FOREIGN PATENT DOCUMENTS

| | | | |
|---|---|---|---|
| CN | 118921984 A * | 11/2024 | ....... H01L 21/76224 |
| KR | 1020010063719 | 7/2001 | |
| KR | 1020030002718 | 11/2003 | |
| KR | 1020050003003 | 1/2005 | |
| KR | 1020040025534 | 2/2006 | |
| KR | 1020030076728 | 4/2006 | |
| KR | 1020070060353 | 6/2007 | |
| KR | 1020110001805 | 12/2011 | |
| KR | 10-2018-0027708 A | 3/2018 | |
| TW | 200903737 | 1/2009 | |
| TW | 202114156 | 4/2021 | |

OTHER PUBLICATIONS

Office Action in Korean Appln. No. 10-2021-0104899, mailed on Apr. 7, 2025, 13 pages (with English translation).

* cited by examiner

SEMICONDUCTOR DEVICE AND MANUFACTURING METHOD

CROSS-REFERENCE TO RELATED APPLICATION

This application claims priority under 35 U.S.C. § 119 to Korean Patent Application No. 10-2021-0104899 filed on Aug. 9, 2021 in the Korean Intellectual Property Office, the subject matter of which is hereby incorporated by reference in its entirety.

BACKGROUND

The inventive concept relates to semiconductor devices and methods of manufacturing same. More particularly, the inventive concept relates to semiconductor devices including a cell capacitor and methods of manufacturing same.

With continued reductions in the overall size of contemporary and emerging semiconductor devices, the respective size of individual microcircuit pattern(s), as well as the size of constituent components continue to decrease. In some semiconductor devices, the height of cell capacitor(s) may increase in accordance with size decrease(s) for individual microcircuit pattern(s). Such trends have increased the difficulty and complexity of fabrication processes associated with the formation of cell capacitor(s). For example, so-called bridge defects between cell capacitors may arise, among other types of possible defects.

SUMMARY

The inventive concept provides semiconductor devices exhibiting a reduced number defects (e.g., bridge defects) and further exhibiting a reduced possibility of defect formation. The inventive concept also provides methods of manufacturing semiconductor devices that exhibit a reduced number defects (e.g., bridge defects) and that further exhibit a reduced possibility of defect formation.

According to an aspect of the inventive concept, there is provided a semiconductor device including: a substrate including a cell area and a peripheral circuit area, wherein the cell area includes cell transistors and the peripheral circuit area includes a peripheral circuit, an etching stop layer including a first portion of the etching stop layer arranged in the cell area and a second portion of the etching stop layer arranged in the peripheral circuit area, and a capacitor structure arranged in the cell area and including lower electrodes respectively connected to the cell transistors via the first portion of the etching stop layer and arranged according to a first pitch, wherein the second portion of the etching stop layer includes recesses arranged according to a second pitch substantially the same as the first pitch.

According to another aspect of the inventive concept, there is provided a semiconductor device including: cell transistors on a substrate, lower electrodes respectively connected to the cell transistors, arranged according to a first pitch in a first horizontal direction, and extending in a vertical direction, and an etching stop layer surrounding lower sidewalls of the lower electrodes and arranged at a level higher than a level of the cell transistors, wherein the etching stop layer includes a first portion vertically overlapping the lower electrodes and a second portion laterally surrounding the first portion, and the second portion includes recesses arranged according to a second pitch in the first horizontal direction.

According to another aspect of the inventive concept, there is provided a semiconductor device including: a substrate including a cell area and a peripheral circuit area, wherein the cell area includes cell transistors and the peripheral circuit area includes a peripheral circuit, an etching stop layer including a first portion of the etching stop layer in the cell area and a second portion of the etching stop layer in the peripheral circuit area, a capacitor structure in the cell area, wherein the capacitor structure includes lower electrodes, a capacitor dielectric layer covering upper surfaces of the lower electrodes, and an upper electrode on the capacitor dielectric layer and covering the lower electrodes, wherein the lower electrodes are respectively connected to the cell transistors via the first portion of the etching stop layer and are arranged according to a first pitch in a first horizontal direction, an interlayer insulating layer on the second portion of the etching stop layer, and a peripheral circuit contact penetrating the interlayer insulating layer and the second portion of the etching stop layer to electrically connect to the peripheral circuit, wherein the second portion of the etching stop layer includes recesses arranged according to a second pitch in the first horizontal direction.

BRIEF DESCRIPTION OF THE DRAWINGS

Embodiments of the inventive concept may be more clearly understood upon consideration of the following detailed description together with the accompanying drawings in which.

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
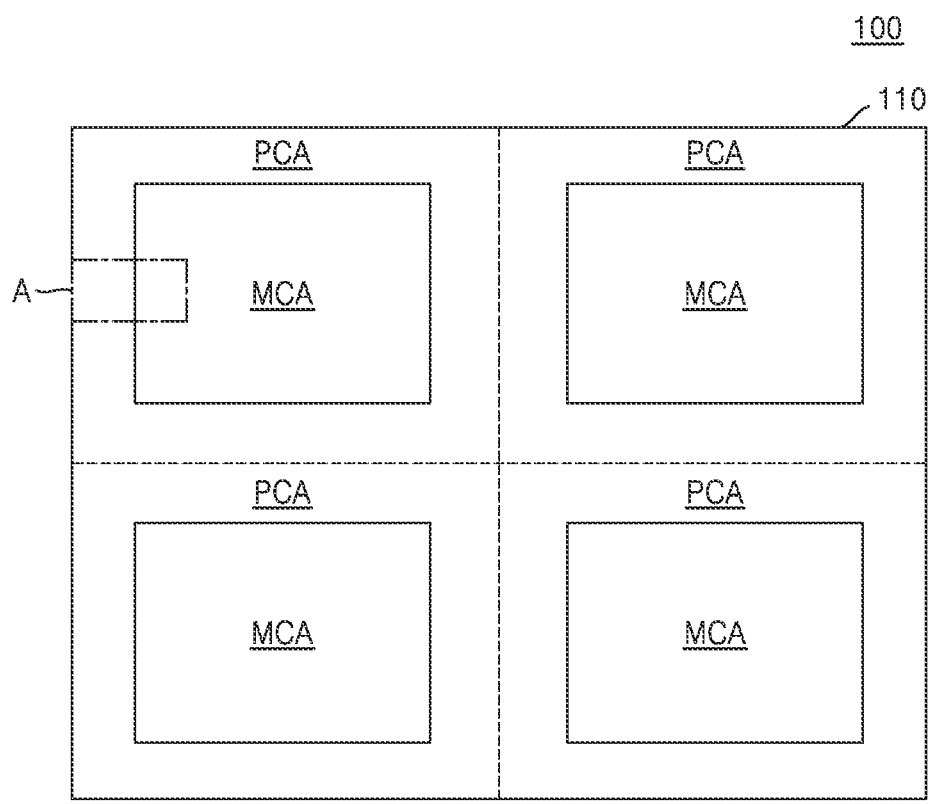
FIG. 1 is a plan (or top-down) view illustrating a semiconductor device 100 according to embodiments of the inventive concept.
Figure 2:
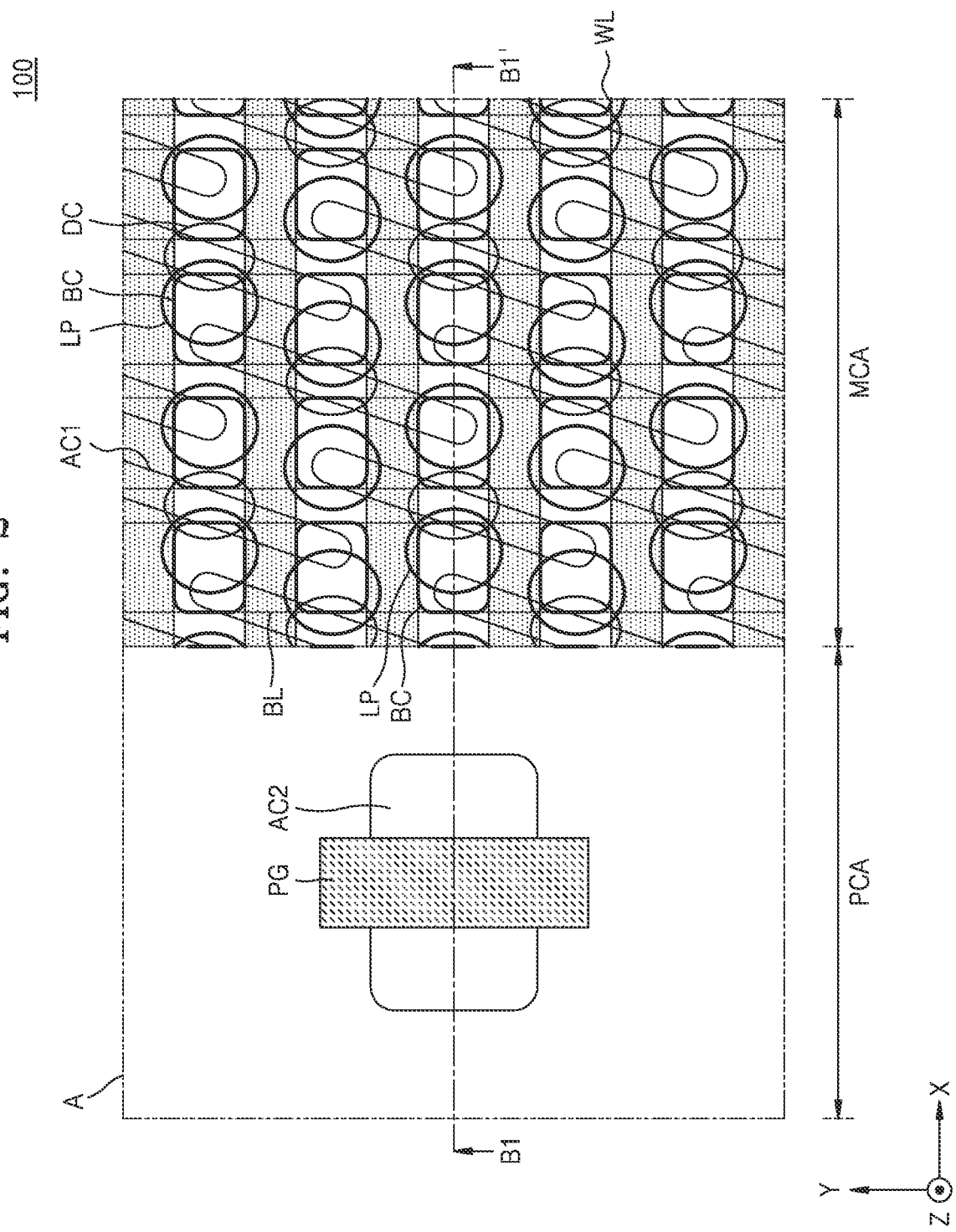
FIG. 2 is an enlarged view of region 'A' indicated in FIG. 1.
Figure 3:
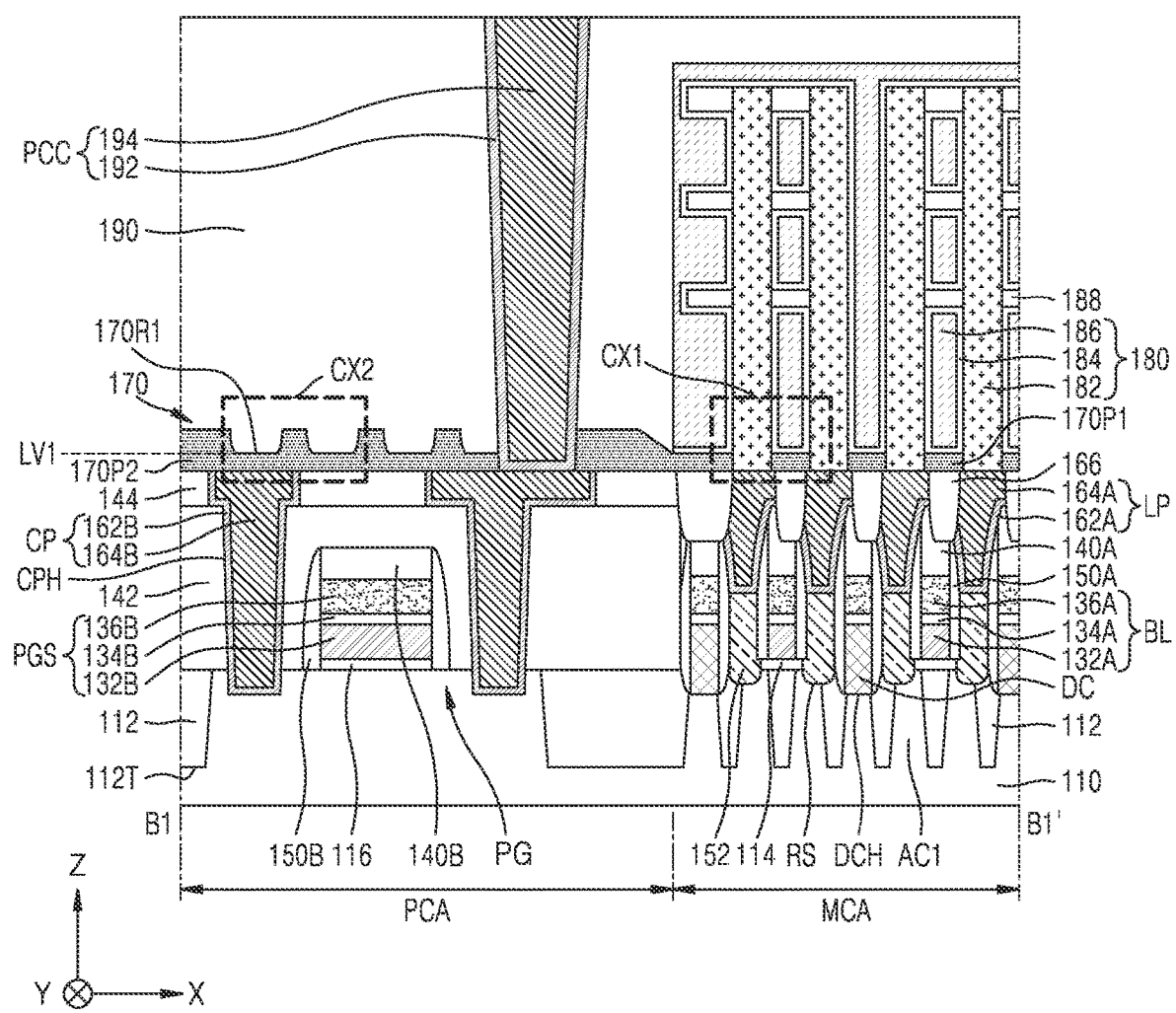
FIG. 3 is a cross-sectional view taken along line B1-B1' of FIG. 2.
Figure 4:
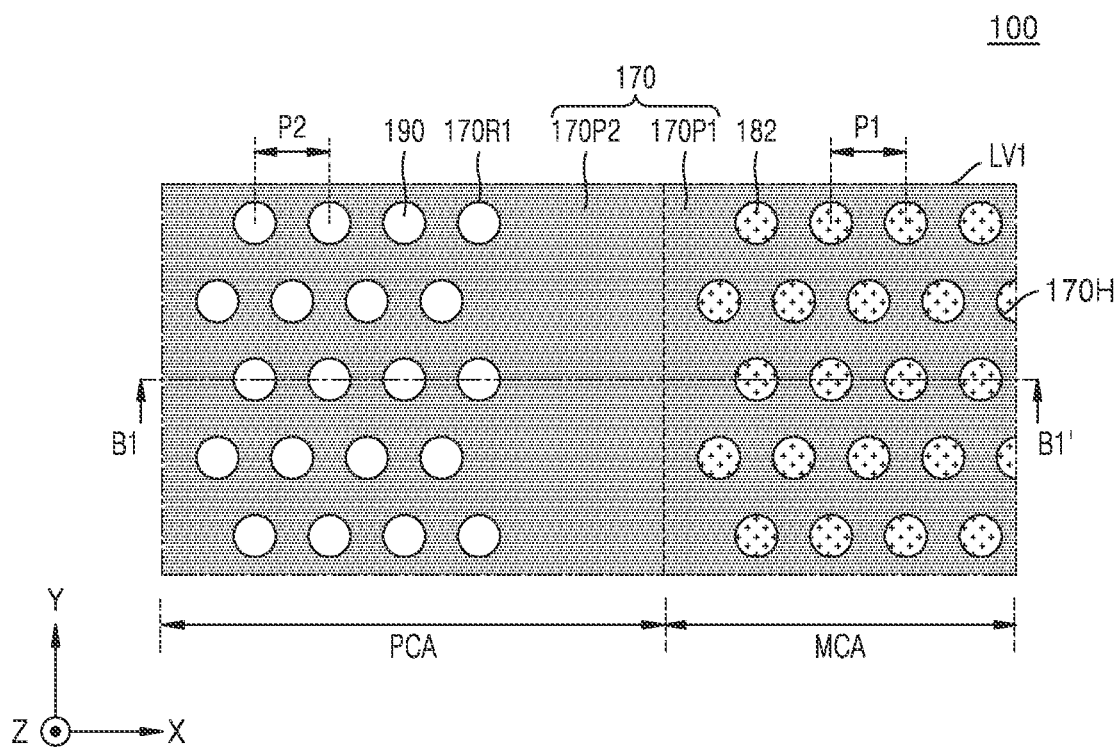
FIG. 4 is a plan view further illustrating the semiconductor device 100 of FIG. 3.
Figure 5:
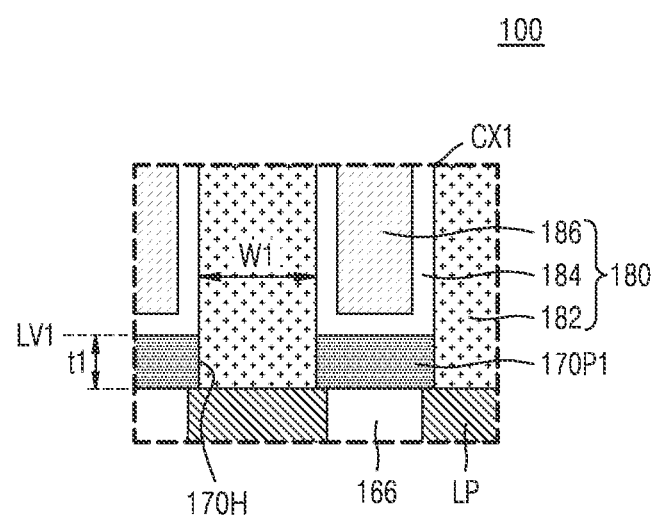
FIG. 5 is an enlarged cross-sectional view of region 'CX1' indicated in FIG. 3.
Figure 6:
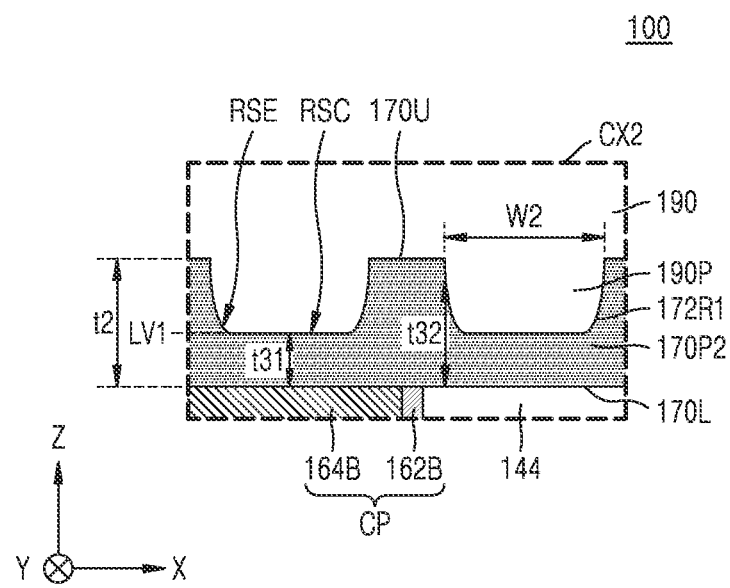
FIG. 6 is an enlarged cross-sectional view of region 'CX2' indicated in FIG. 3.

FIG. 1 is a plan view illustrating a layout of a semiconductor device 100 according to embodiments of the inventive concept; FIG. 2 is another plan view further illustrating an enlarged version of region 'A' indicated in FIG. 1; FIG. 3 is a cross-sectional view taken along line B1-B1' of FIG. 2; FIG. 4 is a plan view further illustrating a first vertical level LV1 of FIG. 3; FIG. 5 is a cross-sectional view further illustrating an enlarged version of region 'CX1' indicated in FIG. 3, and FIG. 6 is a cross-sectional view further illustrating an enlarged version of region 'CX2' indicated in FIG. 3 (hereafter collectively, "FIGS. 1 to 6").

Referring to FIGS. 1 to 6, the semiconductor device 100 may include a substrate 110 including cell array areas MCA and peripheral circuit areas PCA. Here, for example, the cell array area MCA may be a memory cell area of a DRAM device, and the peripheral circuit area PCA may be a core area or a peripheral area of the DRAM device. In some embodiments, the peripheral circuit area PCA may include a peripheral circuit transistor PG configured to provide a signal (e.g., a data signal, an address signal, a power signal, or a command/control signal) to a memory cell array included in the cell array area MCA. In this regard, the peripheral circuit transistor PG may be configured within various circuits such as a command decoder, control logic, an address buffer, a row decoder, a column decoder, a sense amplifier, and a data input/output (I/O) circuit, etc.

A device isolation trench 112T may be formed in the substrate 110, and device isolation layers 112 may be formed in the device isolation trench 112T. First active areas AC1 may be defined in the substrate 110 by the device isolation layer 112 in the cell array area MCA, and a second active area AC2 may be defined in the substrate 110 in the peripheral circuit area PCA.

In the cell array area MCA, the first active areas AC1 may be arranged to have long axes in a diagonal direction with respect to a first horizontal (or X) direction and a second horizontal (or Y) direction intersecting the first horizontal direction. Word lines WL may extend in parallel in the first horizontal direction across the first active areas AC1. Bit lines BL may extend in parallel on the word lines WL in the second horizontal direction. The bit lines BL may be connected to the first active areas AC1 through a direct contact DC.

Buried contacts BC may be formed between two adjacent bit lines BL. The buried contacts BC may be arranged in a row in the first horizontal direction and/or in a column in the second horizontal direction. Landing pads LP may be formed on the buried contacts BC. The buried contacts BC and the landing pads LP may connect to the first active areas AC1, lower electrodes 182 of a capacitor structure 180 formed on upper portions of the bit lines BL. Respective landing pads LP may partially overlap the buried contacts BC.

The substrate 110 may include silicon (Si) (e.g., single crystal silicon, polycrystalline silicon, and/or amorphous silicon). In other embodiments, the substrate 110 may include at least one of germanium (Ge), SiGe, SiC, GaAs, InAs, and InP. In some embodiments, the substrate 110 may include conductive area(s) (e.g., conductive wells and/or various impurity-doped structures). The device isolation layer 112 may include at least one of an oxide layer and a nitride layer.

In the cell array area MCA, word line trenches (not shown) extending in the first horizontal direction may be formed in the substrate 110, and gate dielectric layers (not shown), gate electrodes (not shown), and capping insulating layers (not shown) may be formed in the word line trenches. The gate electrodes may correspond to the word lines WL of FIG. 1. The gate dielectric layers may include at least one of a silicon oxide layer, a silicon nitride layer, a silicon oxynitride layer, an oxide/nitride/oxide (ONO) layer, and a high-k dielectric film having a dielectric constant greater than that of silicon oxide. The gate electrodes may each include at least one of titanium (Ti), titanium nitride (TiN), tantalum (Ta), TaN, tungsten (W), WN, TiSiN and WSiN. The capping insulating layers may each include at least one of a silicon oxide layer, a silicon nitride layer, and a silicon oxynitride layer.

In the cell array area MCA, a buffer layer 114 may be formed on the substrate 110. The buffer layer 114 may include at least one of an oxide layer and a nitride layer.

Direct contacts DC may be formed in direct contact holes DCH in the substrate 110. The direct contacts DC may be connected to the first active areas AC1. The direct contacts DC may include doped polysilicon. For example, the direct contacts DC may include polysilicon doped with at least one N-type impurity, such as phosphorus (P), arsenic (As), bismuth (Bi), and antimony (Sb).

The bit lines BL may extend on the substrate 110 and the direct contacts DC in the second horizontal direction. The bit lines BL may be connected to the first active areas AC1 through the direct contacts DC, respectively. The bit lines BL may include a lower conductive pattern 132A, an intermediate conductive pattern 134A, and an upper conductive pattern 136A that are sequentially stacked on the substrate 110. The lower conductive pattern 132A may include doped polysilicon. The intermediate conductive pattern 134A and the upper conductive pattern 136A may each include at least one of TiN, TiSiN, W and tungsten silicide. In some embodiments, the intermediate conductive pattern 134A may include at least one of TiN and TiSiN, and the upper conductive pattern 136A may include W.

The bit lines BL may be covered by insulating capping layers 140A. The insulating capping layers 140A may extend on the bit lines BL in the second horizontal direction. Spacers 150A may be arranged on both sidewalls of each bit line BL. The spacers 150A may extend on the sidewalls of the bit lines BL in the second horizontal direction, and portions of the spacers 150A may extend to the inside of the direct contact holes DCH and cover both sidewalls of the direct contact DC. FIG. 3 shows the spacer 150A as a single material layer, however in other embodiments, the spacer 150A may have a stacked structure including multiple spacer layers (e.g., two or more spacer layers separated by air gap(s)).

The direct contact DC may be formed in the direct contact hole DCH in the substrate 110 and may extend to a higher level than an upper surface of the substrate 110. For example, an upper surface of the direct contact DC may be at the same level as an upper surface of the lower conductive pattern 132A and may contact a lower surface of the intermediate conductive pattern 134A. Also, a lower surface of the direct contact DC may be at a lower level than the upper surface of the substrate 110. (In this regard, the term "level" denotes a position in the vertical direction relative to an arbitrarily selected horizontal surface (e.g., an upper surface of the substrate 110).

Insulating fences (not shown) and conductive plugs 152 may be arranged between the bit lines BL in a line in the second horizontal direction. The insulating fences may be arranged between the capping insulating layers arranged on upper sides of the word line trenches, and the conductive plugs 152 may extend in a vertical (or Z) direction—a direction intersecting the first and second horizontal directions—from a recess space RS formed in the substrate 110. Both sidewalls of the conductive plugs 152 may be insulated from each other in the second horizontal direction by the insulating fences. The conductive plugs 152 may form the buried contacts BC of FIG. 2.

The landing pads LP may be formed on the conductive plugs 152. Although not shown, a metal silicide layer (not shown) may be further arranged between the conductive plugs 152 and the landing pads LP. The metal silicide layer may include at least one of cobalt silicide, nickel silicide, and manganese silicide. The landing pads LP may each include a conductive barrier layer 162A and a landing pad conductive layer 164A. The conductive barrier layer 162A may include at least one of Ti and TiN. The landing pad conductive layer 164A may include at least one of a metal, a conductive metal nitride and a conductive polysilicon. For example, the landing pad conductive layer 164A may include W. When viewed in a plan view, the landing pads LP may have island patterns. The landing pads LP may be electrically insulated from each other by insulating patterns 166 substantially surrounding the periphery of the landing pads LP.

In the peripheral circuit area PCA, the peripheral circuit transistor PG may be arranged in the second active area AC2. The peripheral circuit transistor PG may include a gate dielectric layer 116, a peripheral circuit gate electrode PGS, and a gate capping pattern 140B that are sequentially stacked in the second active area AC2.

The gate dielectric layer 116 may include at least one of a silicon oxide layer, a silicon nitride layer, a silicon oxynitride layer, an ONO layer, and a high-k dielectric film having a dielectric constant greater than that of silicon oxide. The peripheral circuit gate electrode PGS may include a lower conductive pattern 132B, an intermediate conductive pattern 134B, and an upper conductive pattern 136B. In some embodiments, the lower conductive pattern 132B, the intermediate conductive pattern 134B, and the upper conductive pattern 136B may include the same materials as the lower conductive pattern 132A, the intermediate conductive pattern 134A, and the upper conductive pattern 136A included in the bit line BL in the cell array area MCA. The gate capping pattern 140B may include a silicon nitride layer.

The sidewalls of the peripheral circuit gate electrode PGS may be covered by an insulating spacer 150B. The insulating spacer 150B may include an oxide layer, a nitride layer, or a combination thereof. The peripheral circuit transistor PG may be covered by a first interlayer insulating layer 142. A second interlayer insulating layer 144 may be arranged on the first interlayer insulating layer 142.

In the peripheral circuit area PCA, a contact plug CP may be formed in the contact hole CPH vertically penetrating the first interlayer insulating layer 142 and the second interlayer insulating layer 144. The contact plug CP may include a conductive barrier layer 162B and a landing pad conductive layer 164B, identically to the landing pads LP formed in the cell array area MCA. A metal silicide layer (not shown) may be arranged between the second active area AC2 and the contact plug CP.

An etching stop layer 170 may be arranged on the landing pad LP and the second interlayer insulating layer 144 in the cell array area MCA and the peripheral circuit area PCA. The etching stop layer 170 may include a first portion 170P1 covering the cell array area MCA and a second portion 170P2 covering the peripheral circuit area PCA.

In some embodiments, the etching stop layer 170 may include a material having an etching selectivity with respect to the second interlayer insulating layer 144 and the insulating pattern 166. For example, the etching stop layer 170 may include silicon nitride.

In the cell array area MCA, a capacitor structure 180 may be arranged on the etching stop layer 170. The capacitor structure 180 may include lower electrodes 182, a capacitor dielectric layer 184, and an upper electrode 186.

The lower electrodes 182 may extend, in the vertical direction on the landing pads LP by penetrating the first portion 170P1 of the etching stop layer 170. Lower portions of the lower electrodes 182 may be arranged in an opening 170H of the first portion 170P1 of the etching stop layer 170. A support layer 188 may be arranged on sidewalls of the lower electrodes 182. The support layer 188 may maintain a certain distance between two adjacent lower electrodes 182 and may prevent a tilt or collapse of the lower electrodes 182 during the process(es) involved in the forming of the lower electrodes 182. The support layer 188 may be provided in plural at different levels on the sidewalls of the lower electrodes 182 in the vertical direction.

On the lower electrodes 182, the capacitor dielectric layer 184 may be arranged. The capacitor dielectric layer 184 may extend to an upper surface and a lower surface of the support layer 188 on the sidewalls of the lower electrodes 182 and extend to the first portion 170P1 of the etching stop layer 170. The upper electrode 186 may cover the lower electrodes 182 on the capacitor dielectric layer 184.

In some embodiments, the capacitor dielectric layer 184 may include at least one of zirconium oxide, hafnium oxide, titanium oxide, niobium oxide, tantalum oxide, yttrium oxide, strontium titanium oxide, barium strontium titanium oxide, scandium oxide, and lanthanide oxide. The lower electrode 182 and the upper electrode 186 may each include at least one of ruthenium (Ru), Ti, Ta, niobium (Nb), iridium (Jr), molybdenum (Mo), W, TiN, TaN, NbN, MoN, WN, iridium oxide ($IrO_2$), ruthenium oxide ($RuO_2$), and strontium ruthenium oxide ($SrRuO_3$).

In some embodiments, the lower electrodes 182 may each have a pillar shape extending in the vertical direction, and as illustrated in FIG. 4, the lower electrodes 182 may each have a circular horizontal cross-section. However, the horizontal, cross-sectional shape of the lower electrode 182 is not limited thereto, and instead, the lower electrodes 182 may have various horizontal cross-sectional shapes, such as an oval, a rectangle, a rounded rectangle, a rhombus, a trapezoid, etc.

Also, as illustrated in FIG. 3, the lower electrodes 182 may have pillar shapes having oval horizontal cross-sections along the entire height thereof, but in other embodiments, the lower electrodes 182 may have a more cylindrical shape closer to the closed bottoms. In this case, the lower electrodes 182 may have circular horizontal cross-sections at a first vertical level LV1, but may have annular or ring-shaped horizontal cross-sections at a level higher than that of the first vertical level LV1.

As illustrated in FIG. 4, the lower electrodes 182 may be arranged in a hexagonal pattern. For example, the lower electrodes 182 may be arranged according to a first pitch P1 in the first horizontal direction. That is, the first pitch P1 may be defined as a distance between centers of two adjacent lower electrodes 182 in the first horizontal direction. In some embodiment, the first pitch P1 may range from about 10 nm and about 300 nm. As illustrated in FIG. 5, the lower electrodes 182 may have first "widths" W1 at bottom portions of the lower electrodes 182 (e.g., a distance measured in the first horizontal direction). In some embodiments, the first width W1 may range from between about 10 nm and about 300 nm.

Recesses 170R1 may be formed in an upper surface 170U of the second portion 170P2 of the etching stop layer 170. For example, the recesses 170R1 may be formed as a dummy lower electrode 182D is formed together on the second portion 170P2 of the etching stop layer 170 during the process of forming the lower electrodes 182 and then the dummy lower electrode 182D is removed. A lower surface 170L of the second portion 170P2 of the etching stop layer 170 may be flat, and the recesses 170R1 may be arranged in the upper surface 170U of the second portion 170P2 of the etching stop layer 170.

As illustrated in FIG. 4, the recesses 170R1 may be arranged in a hexagonal pattern. For example, the recesses 170R1 may be arranged according to a second pitch P2 in the first horizontal direction.

That is, the second pitch P2 may be defined as a distance between centers of two adjacent recesses 170R1 in the first horizontal direction. In some embodiments, the second pitch P2 may be substantially the same as the first pitch P1. In some embodiments, the second pitch P2 may range from between about 10 nm and about 300 nm.

As illustrated in FIG. 6, the recesses 170R1 may have second widths W2 at upper portions of the recesses 170R1 in the first horizontal direction. The second width W2 may range from about 100% to about 150% of the first width W1. In some embodiments, the second width W2 may range from between about 10 nm and about 450 nm.

The first portion 170P1 of the etching stop layer 170 may have a first "thickness" t1 (e.g., a distance measured in the vertical direction), and the second portion 170P2 may have a second thickness t2 greater than that of the first thickness t1. For example, the first thickness t1 may be range from between about 1 nm and about 50 nm, and the second thickness t2 may range from between about 2 nm and about 100 nm.

The recesses 170R1 may each include a central portion RSC and an edge portion RSE. The second portion 170P2 of the etching stop layer 170, which vertically overlaps the central portion RSC, may have a third thickness t31, and the second portion 170P2 of the etching stop layer 170, which vertically overlaps the edge portion RSE, may have a fourth thickness t32 greater than that of the third thickness t31.

As described above, the recesses 170R1 may be formed as dummy lower electrodes 182D formed together on the second portion 170P2 of the etching stop layer 170 during the process of forming the lower electrodes 182. Thereafter, the dummy lower electrode 182D may be removed. In particular, when the opening 170H penetrating the first portion 170P1 of the etching stop layer 170 is formed in the cell array area MCA, some upper portions of the second portion 170P2 of the etching stop layer 170 may be removed in the peripheral circuit area PCA. In this manner, the recesses 170R1 may be formed. Also, when the lower electrode 182 penetrating the first portion 170P1 of the etching stop layer 170 is formed in the cell array area MCA, the dummy lower electrode 182D may be formed on the recesses 170R1 in the second portion 170P2 of the etching stop layer 170, and then may be removed in the peripheral circuit area PCA.

As described above, the second portion 170P2 of the etching stop layer 170 may have a thickness greater than a thickness of the first portion 170P1. Therefore, when the opening 170H is formed in the first portion 170P1 of the etching stop layer 170 and the landing pad LP arranged under the first portion 170P1 of the etching stop layer 170 is exposed during the process of forming the lower electrode 182 and the dummy lower electrode 182D, the second portion 170P2 of the etching stop layer 170 may not be completely removed, and the contact plug CP arranged under the second portion 170P2 of the etching stop layer 170 may not be exposed.

An interlayer insulating layer 190 covering the capacitor structure 180 may be arranged on the etching stop layer 170. The interlayer insulating layer 190 may cover both the cell array area MCA and the peripheral circuit area PCA. A portion of the interlayer insulating layer 190, which is on the second portion 170P2 of the etching stop layer 170, may include protrusions 190P protruding downwards from a lower portion of the interlayer insulating layer 190. The protrusions 190P may conform to, or correspond to, the recesses 170R1 and fill the inside thereof.

In the peripheral circuit area PCA, a peripheral circuit contact PCC may be arrange that penetrates the interlayer insulating layer 190 and extends in the vertical direction. A lower portion of the peripheral circuit contact PCC may be connected to the contact plug CP by penetrating the second portion 170P2 of the etching stop layer 170. For example, the lower portion of the peripheral circuit contact PCC may be electrically connected to the peripheral circuit transistor PG through the contact plug CP. The peripheral circuit contact PCC may include a conductive barrier layer 192 and a contact conductive layer 194.

In general, as an aspect ratio of the lower electrode 182 increases, the difficulty (e.g., in a manufacturing process(es) context) of the uniformly forming the lower electrodes 182 increases commensurately. In particular, because of difference(s) in physical and/or material properties between the cell array area MCA and the peripheral circuit area PCA, mechanical stress may be applied to the substrate 110, thereby inducing warpage. In some embodiments, compared to the lower portions of the lower electrodes 182, compressive stress in a towards-center, horizontal direction may be applied to the upper portions of the lower electrodes 182, thereby tending to form or facilitate the formation of defects (e.g., bridge defects) between the lower electrodes 182.

However, in some embodiments, as the dummy lower electrode 182D is formed in the peripheral circuit area PCA during the process of forming the lower electrodes 182 in the cell array area MCA, the application of the fore-mentioned stress may be inhibited or prevented. That is, stress generated due to difference(s) in physical/materials properties between the cell array area MCA and the peripheral circuit area PCA may be greatly reduced or completely avoided, thus reducing the possibility of forming defects (e.g., bridge defects) between the lower electrodes 182.

Figure 7:
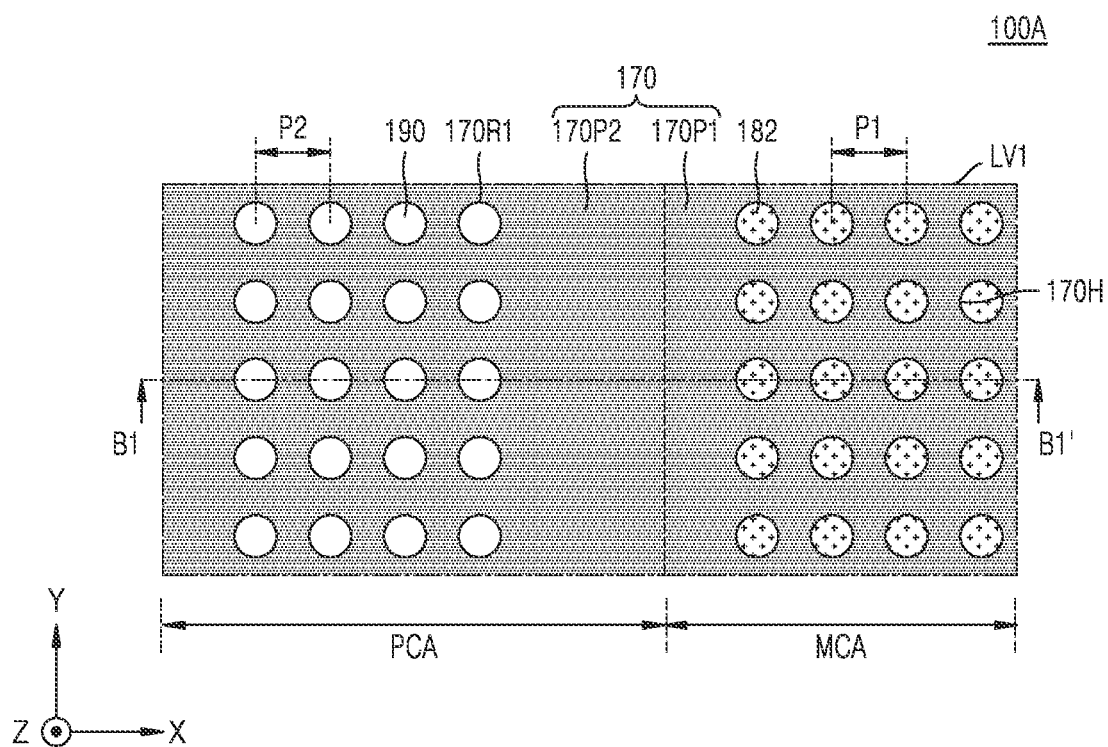
FIG. 7 is a plan view illustrating a semiconductor device 100A according to embodiments of the inventive concept.

FIG. 7 is a plan view further illustrating a semiconductor device 100A according to embodiments of the inventive concept.

Referring to FIG. 7, the lower electrodes 182 may be arranged in a matrix in the first horizontal direction and the second horizontal direction and according to the first pitch P1. Also, the recesses 170R1 may be arranged in a matrix form in the first horizontal direction and the second horizontal direction and according to the second pitch P2 that is substantially the same as the first pitch P1.

Figure 8:
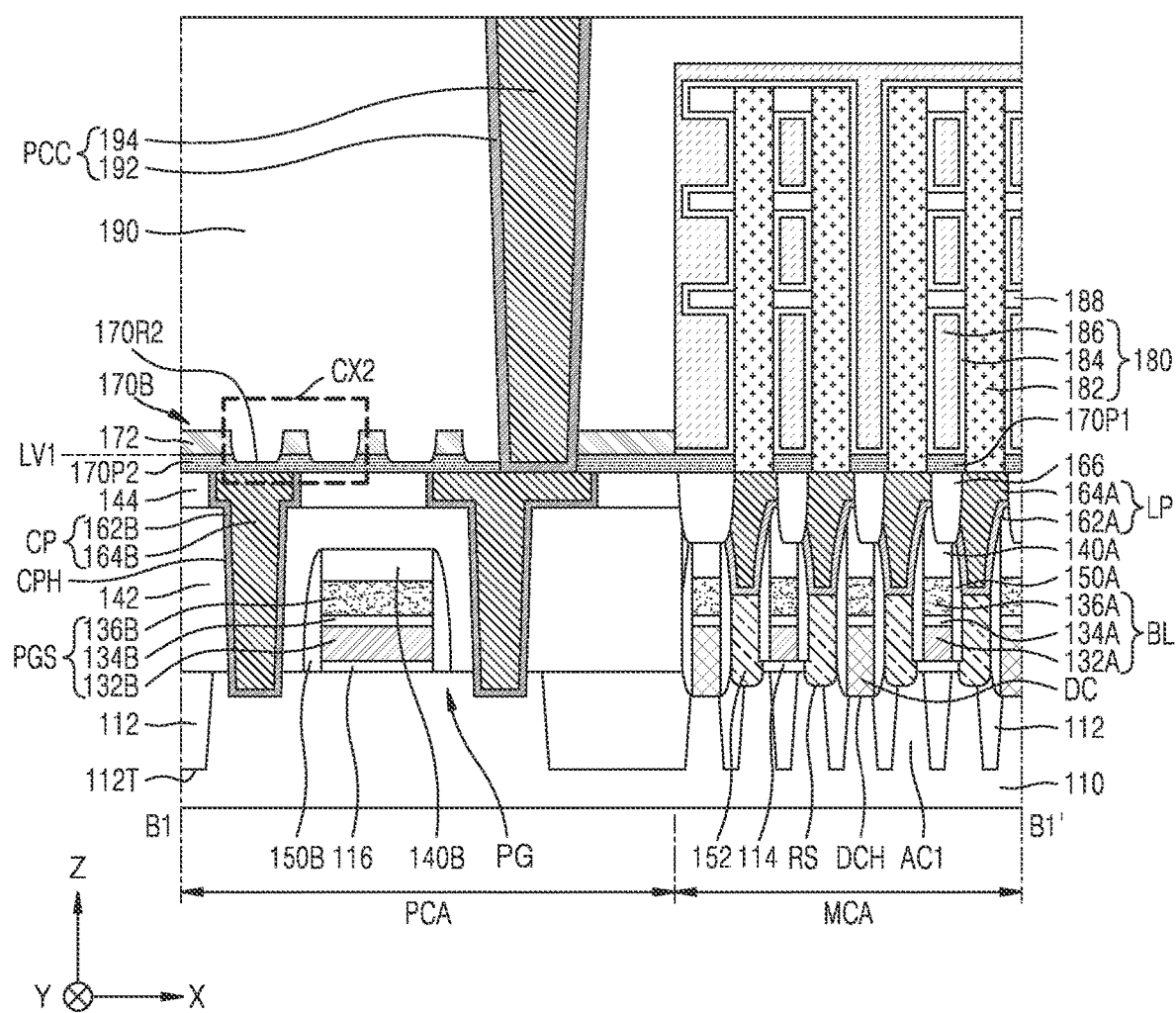
FIG. 8 is a cross-sectional view illustrating a semiconductor device 100B according to embodiments of the inventive concept.
Figure 9:
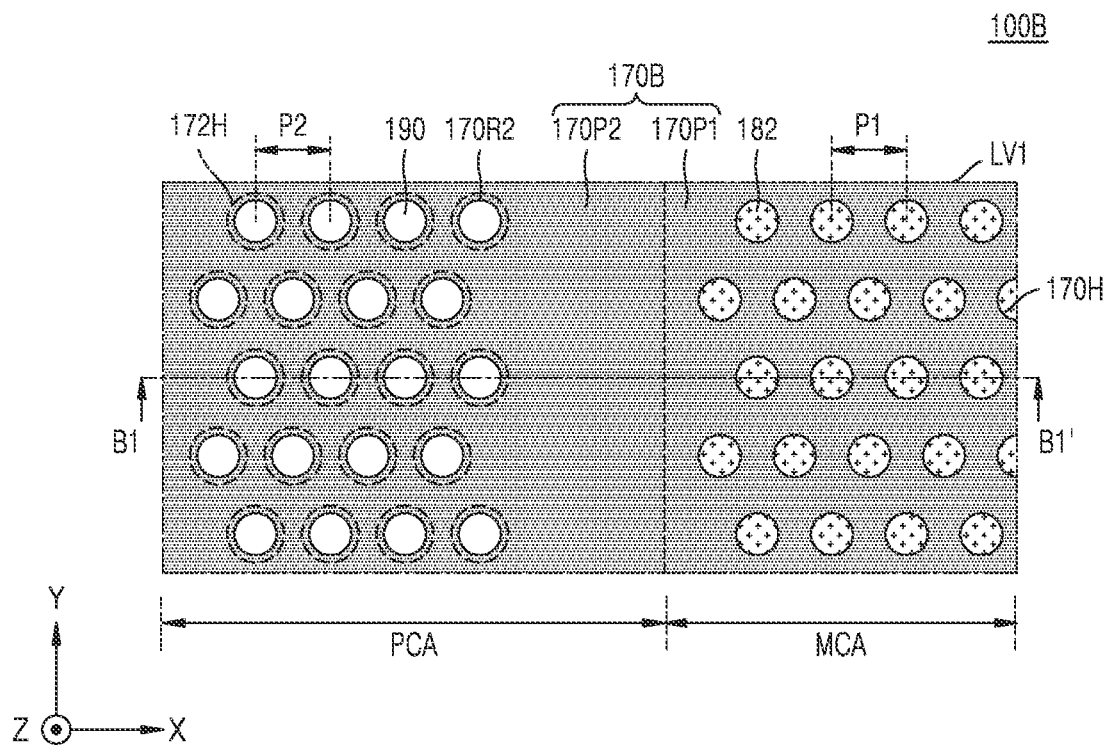
FIG. 9 is a plan view further illustrating the semiconductor device 100B of FIG. 8.

FIG. 8 is a cross-sectional view of a semiconductor device 100B according to embodiments of the inventive concept. FIG. 9 is a plan view further illustrating the semiconductor device 100B of FIG. 8 at the first vertical level LV1, and FIG. 10 is a cross-sectional view further illustrating an enlarged version of the region 'CX2' of FIG. 8.

Figure 10:
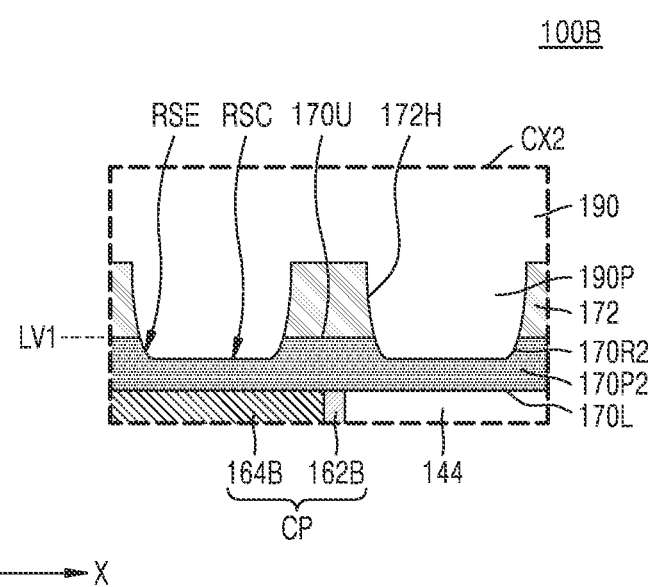
FIG. 10 is an enlarged cross-sectional view of region 'CX2' indicated in FIG. 8.

Referring to FIGS. 8, 9 and 10, a buffer insulating layer 172 may be arranged on the second portion 170P2 of an etching stop layer 170B, and the interlayer insulating layer 190 may be arranged on the buffer insulating layer 172. The buffer insulating layer 172 may include openings 172H, wherein the openings 172H are respectively disposed at locations corresponding to the recesses 170R2 of the etching stop layer 170B.

For example, as illustrated in FIG. 10, inner walls of the recesses 170R2 and the openings 172H respectively corresponding to the recesses 170R2 may be continuously (or smoothly) connected. The protrusions 190P of the interlayer insulating layer 190 may fill the inner walls of the openings 172H and the inner walls of the recesses 170R2.

In some embodiments, the first portion 170P1 and the second portion 170P2 of the etching stop layer 170B may have the same thickness, and the buffer insulating layer 172 may be arranged on the second portion 170P2 of the etching stop layer 170B. Accordingly, when the opening 170H is formed in the first portion 170P1 of the etching stop layer 170B and the landing pad LP arranged under the first portion 170P1 of the etching stop layer 170B is exposed in the process of forming the lower electrode 182 and the dummy lower electrode 182D, the second portion 170P2 of the etching stop layer 170B may not be completely removed, and the contact plug CP arranged under the second portion 170P2 of the etching stop layer 170B may not be exposed.

FIGS. 11 to 24 are related cross-sectional views illustrating in one example a method of manufacturing the semiconductor device 100 of FIG. 1.

Figure 11:
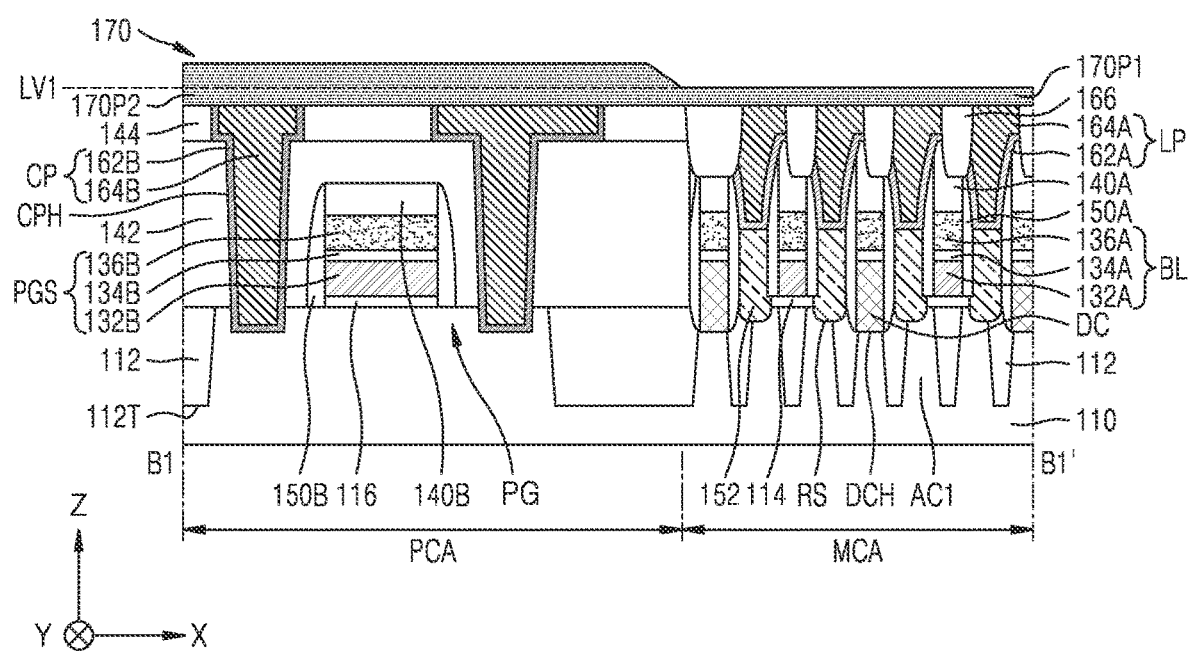
FIGS. 11, 12, 13, 14, 15, 16, 17, 18, 19, 20, 21, 22, 23 and 24 (hereafter collectively, "FIGS. 11 to 24") are related cross-sectional views illustrating in one example a method of manufacturing a semiconductor device according to embodiments of the inventive concept.

Referring to FIG. 11, as the device isolation trenches 112T and the device isolation layers 112 are formed on the substrate 110 including the cell array area MCA and the peripheral circuit area PCA, the first active areas AC1 are defined in the cell array area MCA of the substrate 110, and the second active areas AC2 are defined in the peripheral circuit area PCA.

Then, the buffer layer 114 may be formed on the substrate 110 in the cell array area MCA, and the gate dielectric layer 116 may be formed on the substrate 110 in the peripheral circuit area PCA.

Then, the direct contact hole DCH, through which the first active area AC1 of the substrate 110 is exposed, may be formed by removing a portion of the substrate 110, and the direct contact DC may be formed in the direct contact hole DCH. Then, the bit lines BL and the insulating capping layer 140A may be formed on the buffer layer 114 and the direct contact DC in the cell array area MCA, and the peripheral circuit gate electrode PGS and the gate capping pattern 140B may be formed on the gate dielectric layer 116 in the peripheral circuit area PCA. The insulating spacer 150B may be formed on the sidewall of the peripheral circuit gate electrode PGS, and the first interlayer insulating layer 142 covering the peripheral circuit gate electrode PGS may be formed.

In the cell array area MCA, the spacer 150A may be formed on the sidewalls of the bit line BL and the insulating capping layer 140A, and insulating fences (not shown) may be respectively formed between the bit lines BL. By removing a portion of the substrate 110 that is arranged on the bottom of the contact space (not shown) between the bit lines BL and between the insulating fences, recess spaces RS, where the first active areas AC1 of the substrate 110 are exposed, are formed between the bit lines BL. Then, the conductive plugs 152 filling the recess spaces RS and portions of contact spaces respectively between the bit lines BL are formed.

Then, the contact holes CPH, through which the second active areas AC2 of the substrate 110 are exposed, are formed by etching the first interlayer insulating layer 142 in the peripheral circuit area PCA.

In the cell array area MCA and the peripheral circuit area PCA, a conductive barrier layer (not shown) and a conductive layer (not shown) covering an exposed surface on the substrate 110 are formed. The landing pads LP including the conductive barrier layer 162A and the landing pad conductive layer 164A are formed in the cell array area MCA by patterning the conductive barrier layer and the conductive layer, and the contact plugs CP including the conductive barrier layer 162B and the landing pad conductive layer 164B are formed in the peripheral circuit area PCA. The landing pads LP may have island patterns when viewed in a plan view. Then, the insulating pattern 166 surrounding the sidewalls of the landing pads LP and the second interlayer insulating layer 144 covering the sidewalls of the contact plug CP may be formed.

The etching stop layer 170 may be formed on the insulating pattern 166 and the second interlayer insulating layer 144. In some embodiments, a portion of the etching stop layer 170 may be removed by a certain thickness in the cell array area MCA so that the first portion 170P1 in the cell array area MCA may have a different thickness from the second portion 170P2 in the peripheral circuit area PCA.

Figure 12:
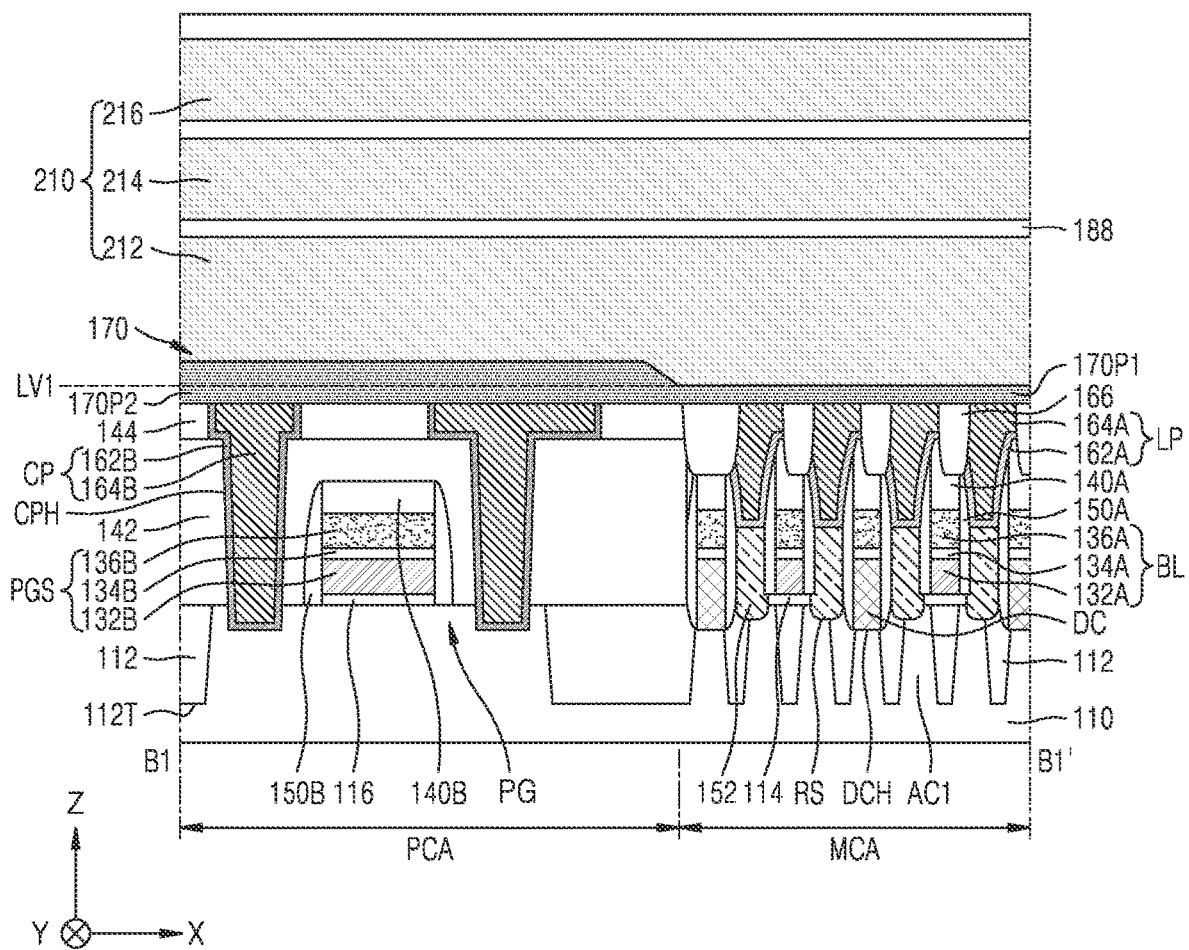

Referring to FIG. 12, a mold structure 210 may be formed on the etching stop layer 170. For example, the mold structure 210 may include a first mold layer 212, a second mold layer 214, and a third mold layer 216 that are sequentially stacked on the etching stop layer 170. Also, the support layers 188 may be selectively formed between the first mold layer 212 and the second mold layer 214 and between the second mold layer 214 and the third mold layer 216.

FIG. 12 further includes three (3) support layers 188, but the number of support layers 188 may vary by design (e.g., according to the height(s) of the lower electrodes 182).

In some embodiments, the support layers 188 may be formed using a material having an etching selection ratio with respect to a material forming the mold structure 210. For example, in some embodiments, the first, second, and third mold layers 212, 214, and 216 may be formed of silicon oxide, and the support layers 188 may be formed of silicon nitride.

Figure 13:
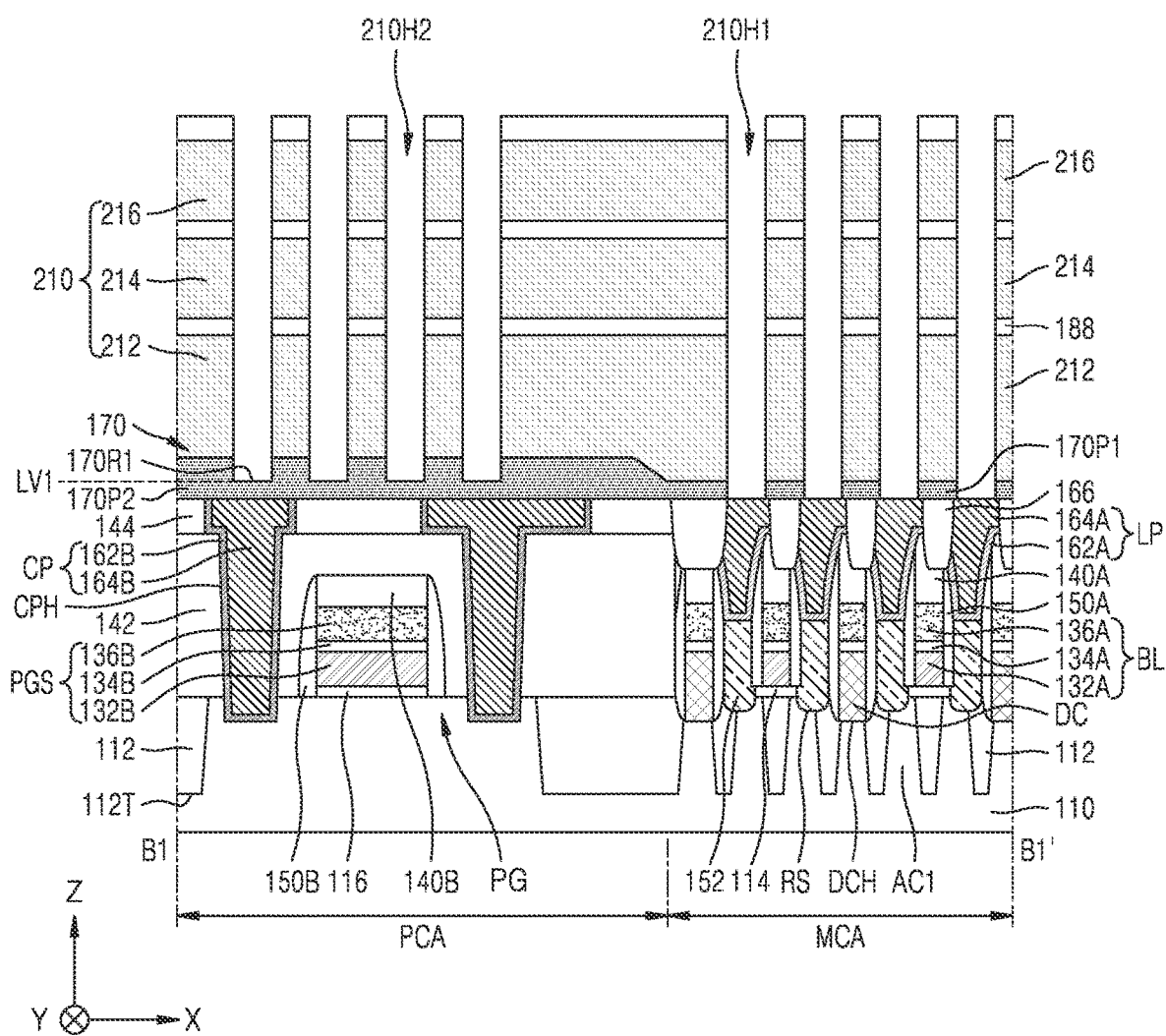

Referring to FIGS. 4, 5 and 13, a mask pattern (not shown) may be formed on the mold structure 210, a first opening 210H1 penetrating the mold structure 210 may be formed in the cell array area MCA by using the mask pattern as an etching mask, and a second opening 210H2 penetrating the mold structure 210 may be formed in the peripheral circuit area PCA. For example, the first and second openings 210H1 and 210H2 may be arranged in a hexagonal pattern. For example, the first opening 210H1 may be arranged according to the first pitch P1, and the second opening 210H2 may be arranged according to the second pitch P2, that is substantially the same as the first pitch P1.

By further removing the first portion 170P1 of the etching stop layer 170 exposed on a lower portion of the first opening 210H1, the opening 170H may be formed, and an upper surface of the landing pad LP may be exposed. In this case, the second portion 170P2 of the etching stop layer 170, which is exposed on a lower portion of the second opening 210H2, may also be removed, and thus, the recesses 170R1 may be formed. Because the second portion 170P2 of the etching stop layer 170 is greater in thickness than the first portion 170P1 thereof, the second interlayer insulating layer 144 or the contact plug CP under the second portion 170P2 of the etching stop layer 170 may not be exposed.

Figure 14:
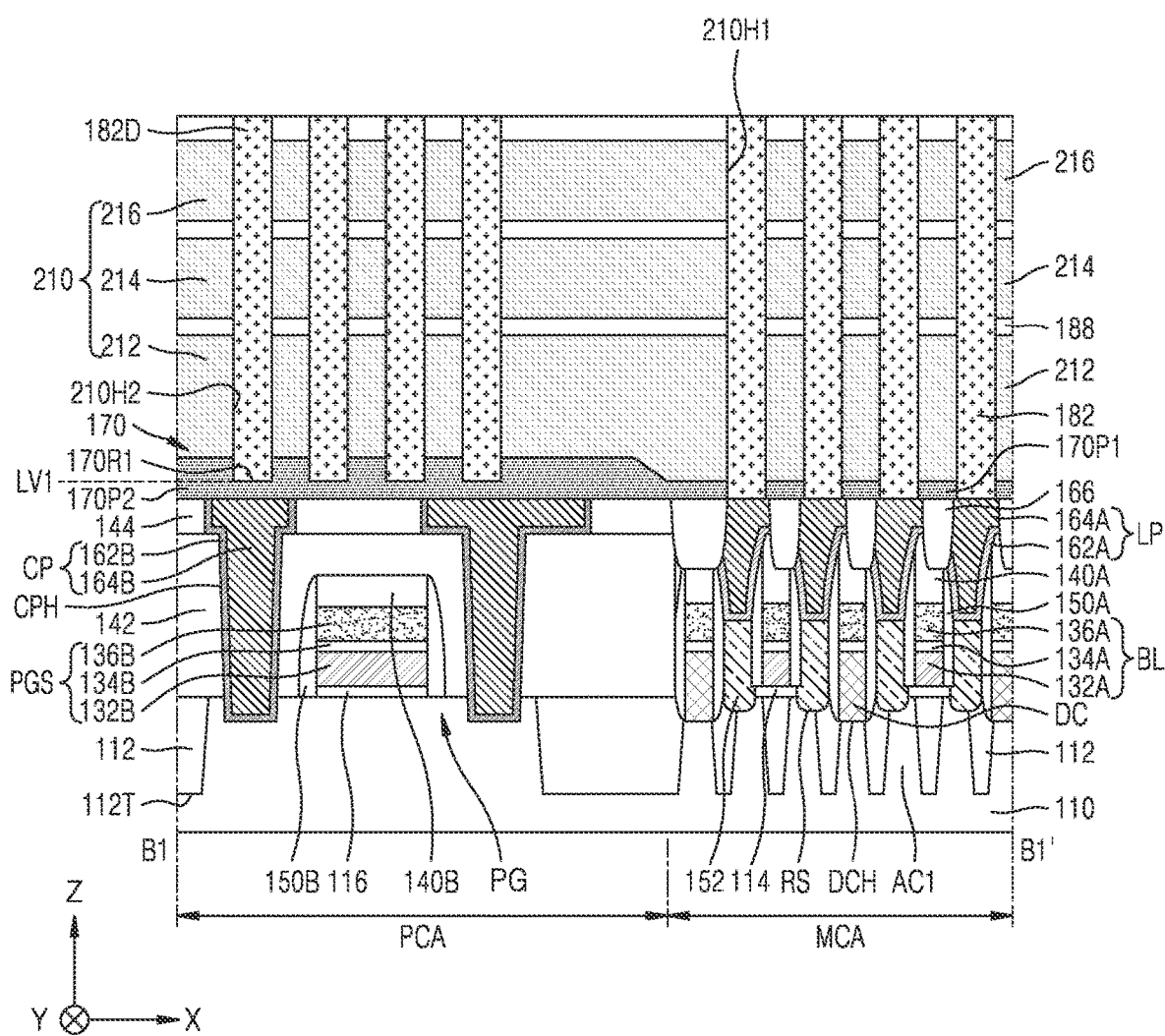

Referring to FIG. 14, a conductive layer (not shown) filling the inside of the first and second openings 210H1 and 210H2 may be formed, and the lower electrode 182 and the dummy lower electrode 182D may be formed respectively in the first opening 210H1 and the second opening 210H2 by planarizing an upper portion of the conductive layer to expose an upper surface of the uppermost support layer 188.

The lower surface of the lower electrode 182 may contact the landing pad LP, and the lower surface of the dummy lower electrode 182D may contact the second portion 170P2 of the etching stop layer 170 and may be arranged in the recesses 170R1.

Because the lower electrode 182 is formed in the cell array area MCA and the dummy lower electrode 182D having the same pitch and shape as the lower electrode 182 is formed in the peripheral circuit area PCA, the application of stress to the substrate 110, which may occur due to difference(s) in physical/materials properties between the cell array area MCA and the peripheral circuit area PCA, may be prevented. Accordingly, a tilt or collapse of the lower electrode 182 may be prevented in the cell array area MCA of the substrate 110.

Figure 15:
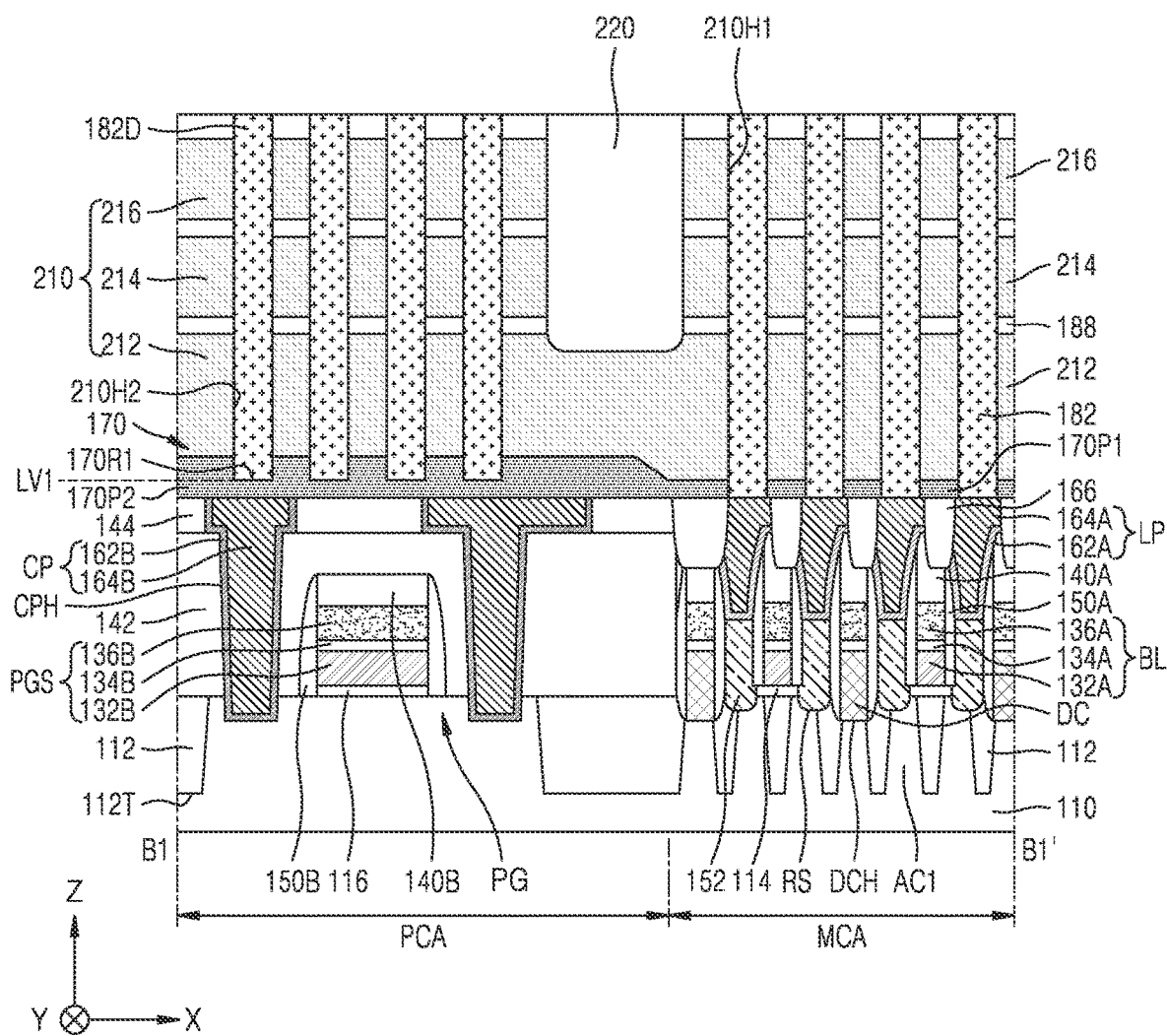

Referring to FIG. 15, an opening (not shown) may be formed by forming a mask pattern (not shown) on the mold structure 210 and removing a portion of the mold structure 210 by using the mask pattern as an etch mask. Then, a dam structure 220 may be formed in the opening.

Although not shown, the dam structure 220 may have a ring shape laterally surrounding the cell array area MCA and may be arranged between the cell array area MCA and the peripheral circuit area PCA, for example, between the lower electrode 182 and the dummy lower electrode 182D.

The dam structure 220 may have a lower surface at a lower level than the lowermost support layer 188, and thus, sidewalls of the dam structure 220 may contact the first, second, and third mold layers 212, 214, and 216.

In some embodiments, the dam structure 220 may be formed using a material having an etching selectivity to the mold structure 210 and the support layer 188. For example, the dam structure 220 may include at least one of a spin on hard mask (SOH), an amorphous carbon layer (ACL), silicon, and silicon carbide. However, one or more embodiments are not limited thereto.

Figure 16:
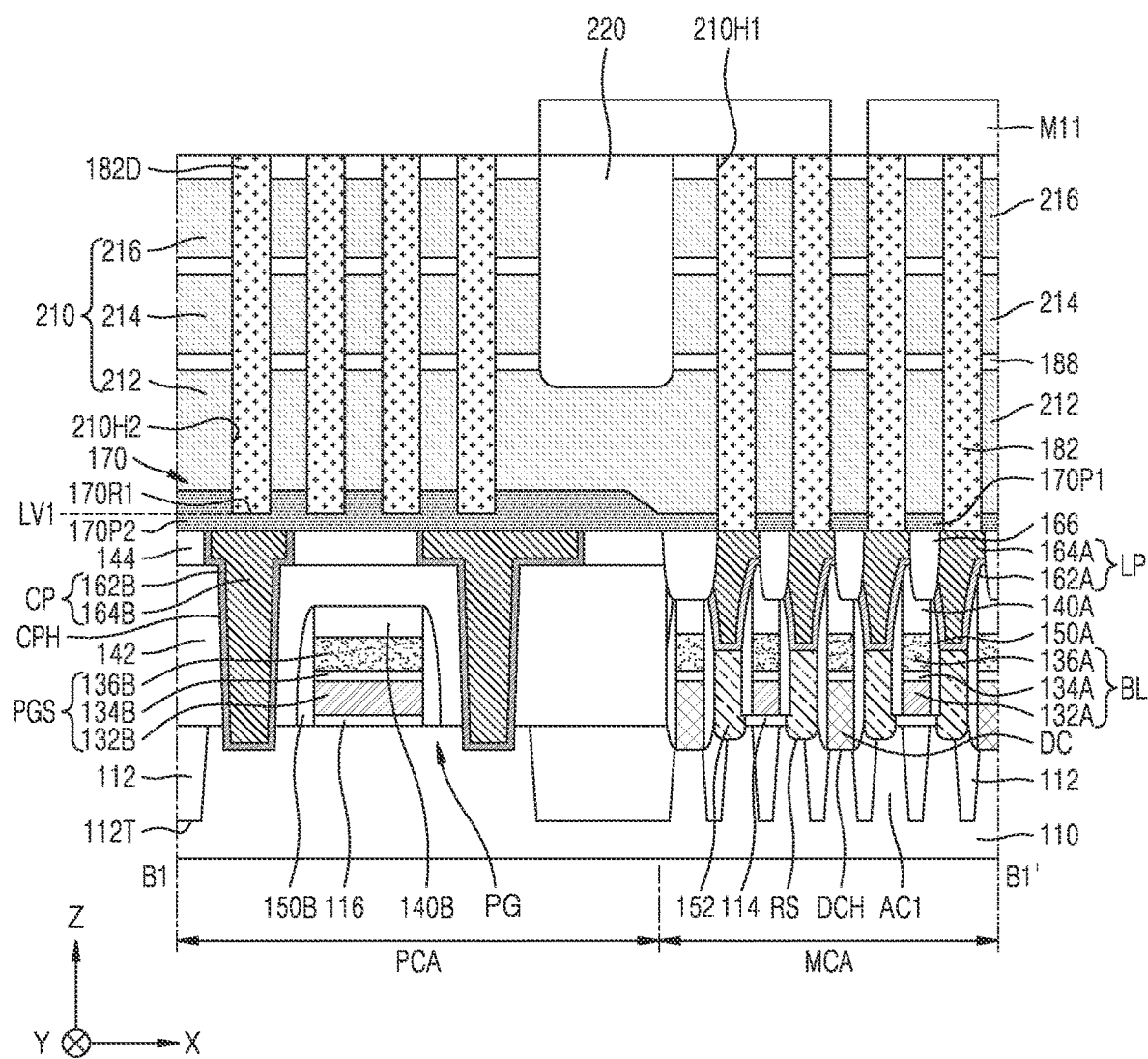

Referring to FIG. 16, a cover mask pattern M11 covering the upper surface of the lower electrode 182 and the dam structure 220 may be formed in the cell array area MCA. The cover mask pattern M11 may include an opening M11H through which the upper surface of the support layer 188 is exposed.

Figure 17:
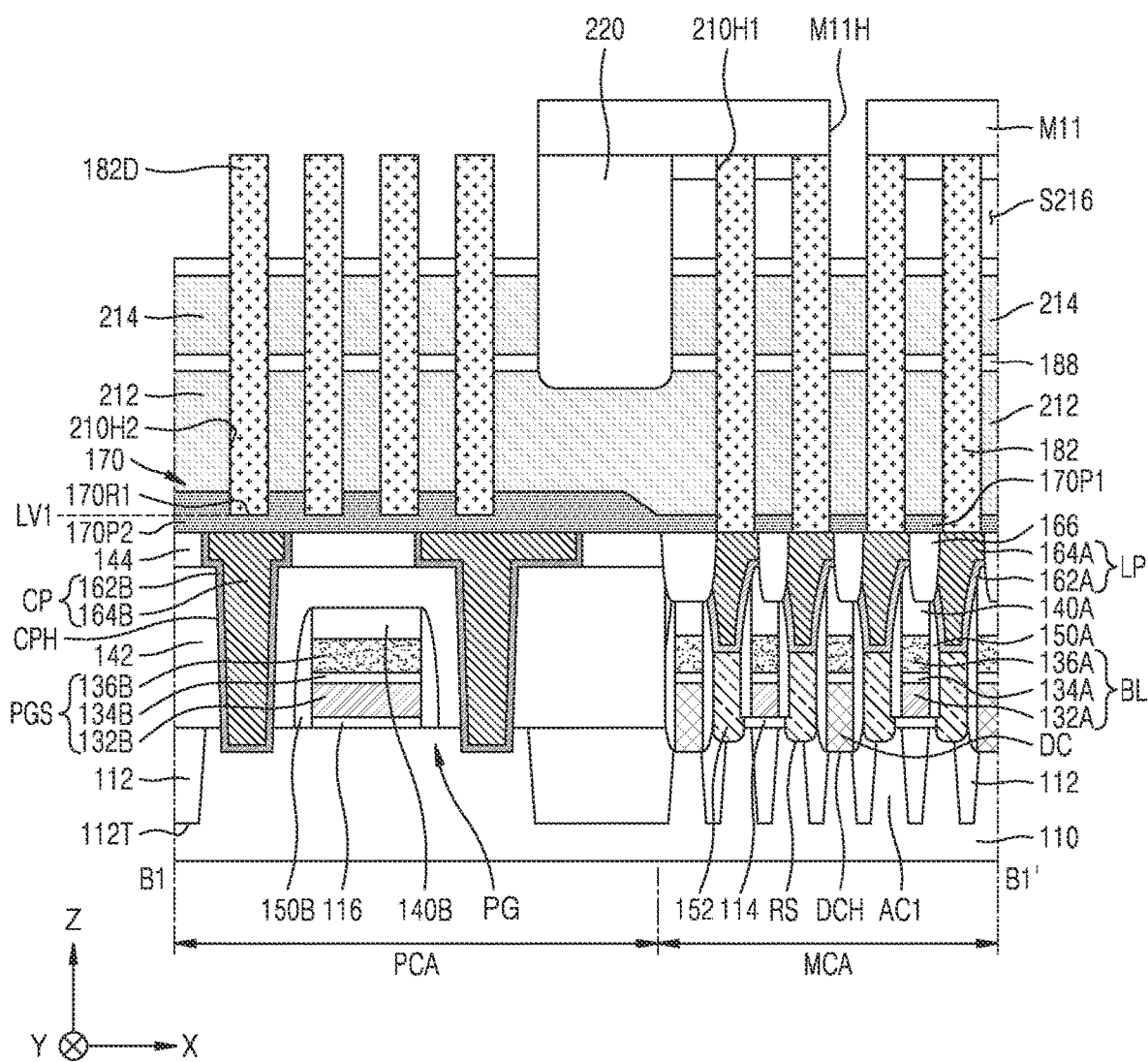

Referring to FIGS. 16 and 17, a portion of the uppermost support layer 188, which is exposed through the opening M11H, may be removed, and the opening M11H may extend downwards. In this case, a portion of the uppermost support layer 188 surrounding the sidewalls of the dummy lower electrode 182D may also be removed.

Then, the third mold layer 216 may be removed through the opening M11H, and a third mold space S216 may be formed in a portion from which the third mold layer 216 is removed. Upper sidewalls of the lower electrode 182 may be exposed through the third mold space S216. Also, a portion of the third mold layer 216 surrounding the upper sidewalls of the dummy lower electrode 182D may also be removed, and the upper sidewalls of the dummy lower electrode 182D may be exposed. In the above removal process, the dam structure 220 may not be removed, and upper sidewalls of the dam structure 220 may be exposed.

In some embodiments, a process of removing the third mold layer 216 may be an etching process using an etchant including at least one of water, ammonium fluoride ($NH_4F$), and hydrofluoric acid (HF).

Figure 18:
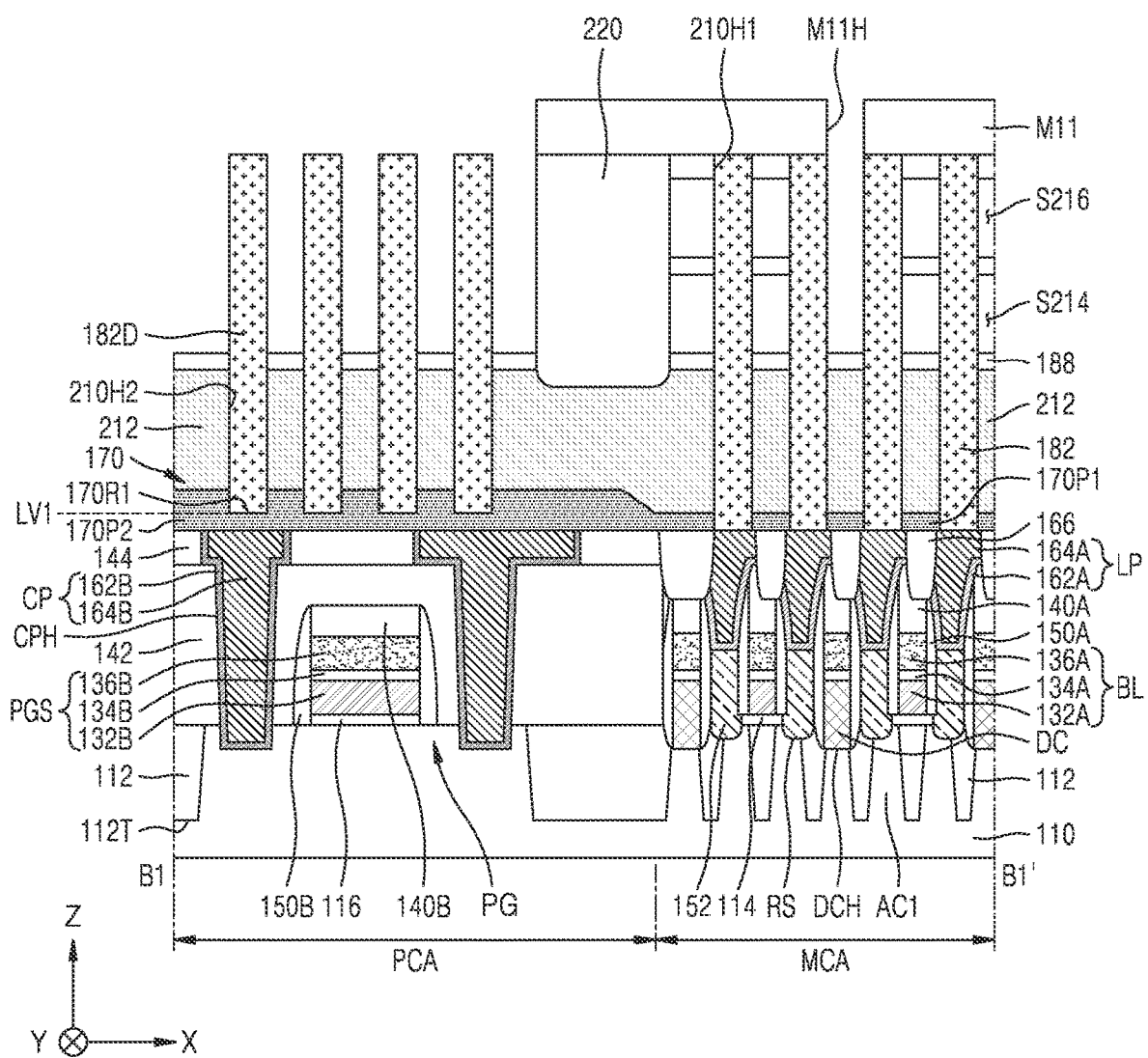

Referring to FIGS. 17 and 18, a portion of the support layer 188 (e.g., a portion of the support layer 188 exposed through the third mold space S216), which is exposed through the opening M11H, may be removed, and the opening M11H may extend downwards. In this case, a portion of the support layer 188 surrounding the sidewalls of the dummy lower electrode 182D may also be removed.

Then, the second mold layer 214 may be removed through the opening M11H, and a second mold space S214 may be formed in an area where the second mold layer 214 is removed. The upper sidewalls of the lower electrode 182 may be exposed through the second mold space S214. Also, a portion of the second mold layer 214 surrounding the upper sidewalls of the dummy lower electrode 182D may also be removed, and the upper sidewalls of the dummy lower electrode 182D may be exposed.

Figure 19:
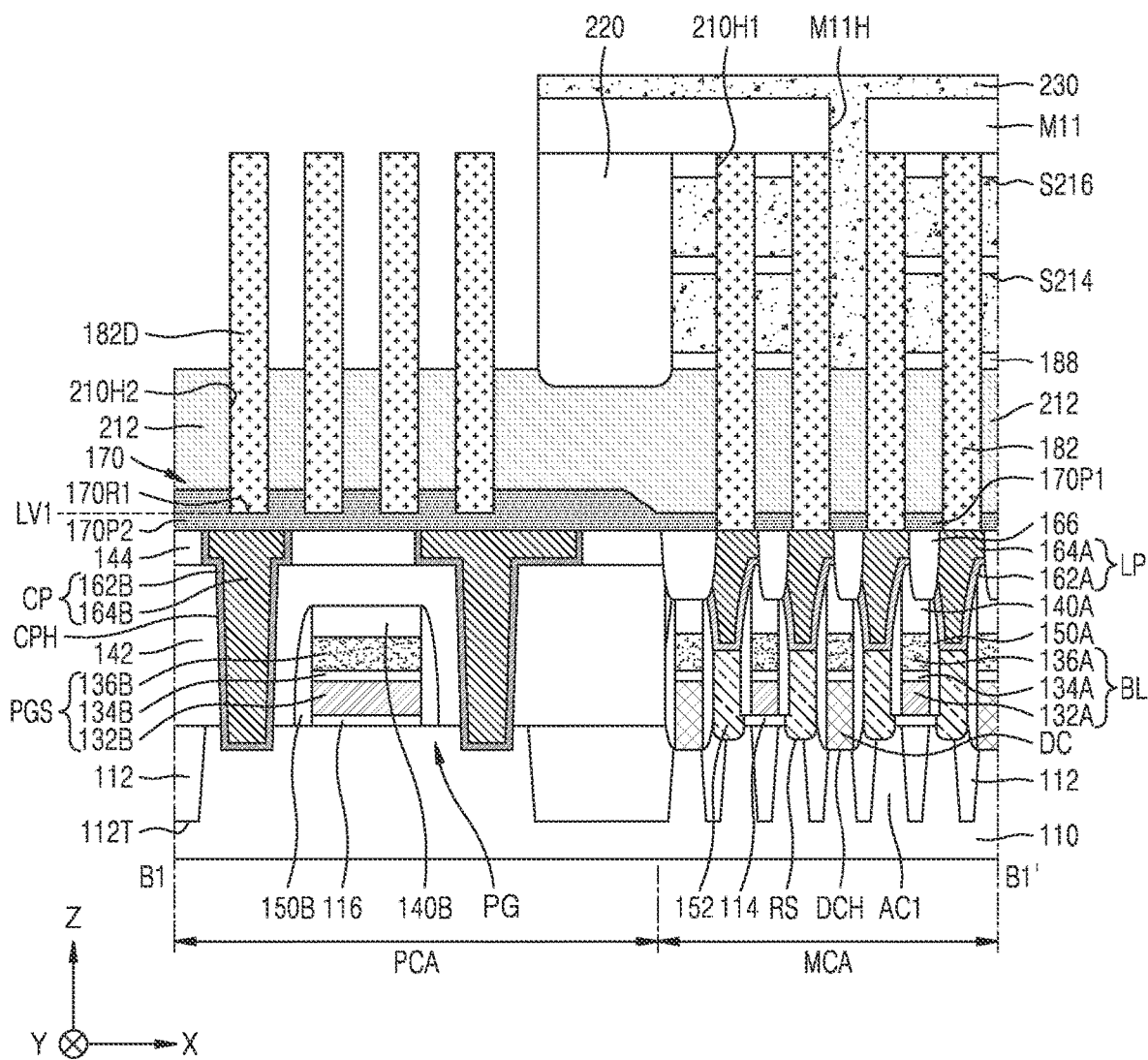

Referring to FIG. 19, a portion of the lowermost support layer 188, which is exposed through the opening M11H, may be removed. In this case, a portion of the lowermost support layer 188 surrounding the sidewalls of the dummy lower electrode 182D may also be removed.

Then, a protective layer 230 filling the second mold space S214 and the third mold space S216 and covering the mask pattern M11 may be formed. The protective layer 230 may only cover the lower electrode 182 in the cell array area MCA, but may not cover the dummy lower electrode 182D in the peripheral circuit area PCA.

In some embodiments, the protective layer 230 may include at least one of photoresist, an SOH, and an ACL, but one or more embodiments are not limited thereto.

Figure 20:
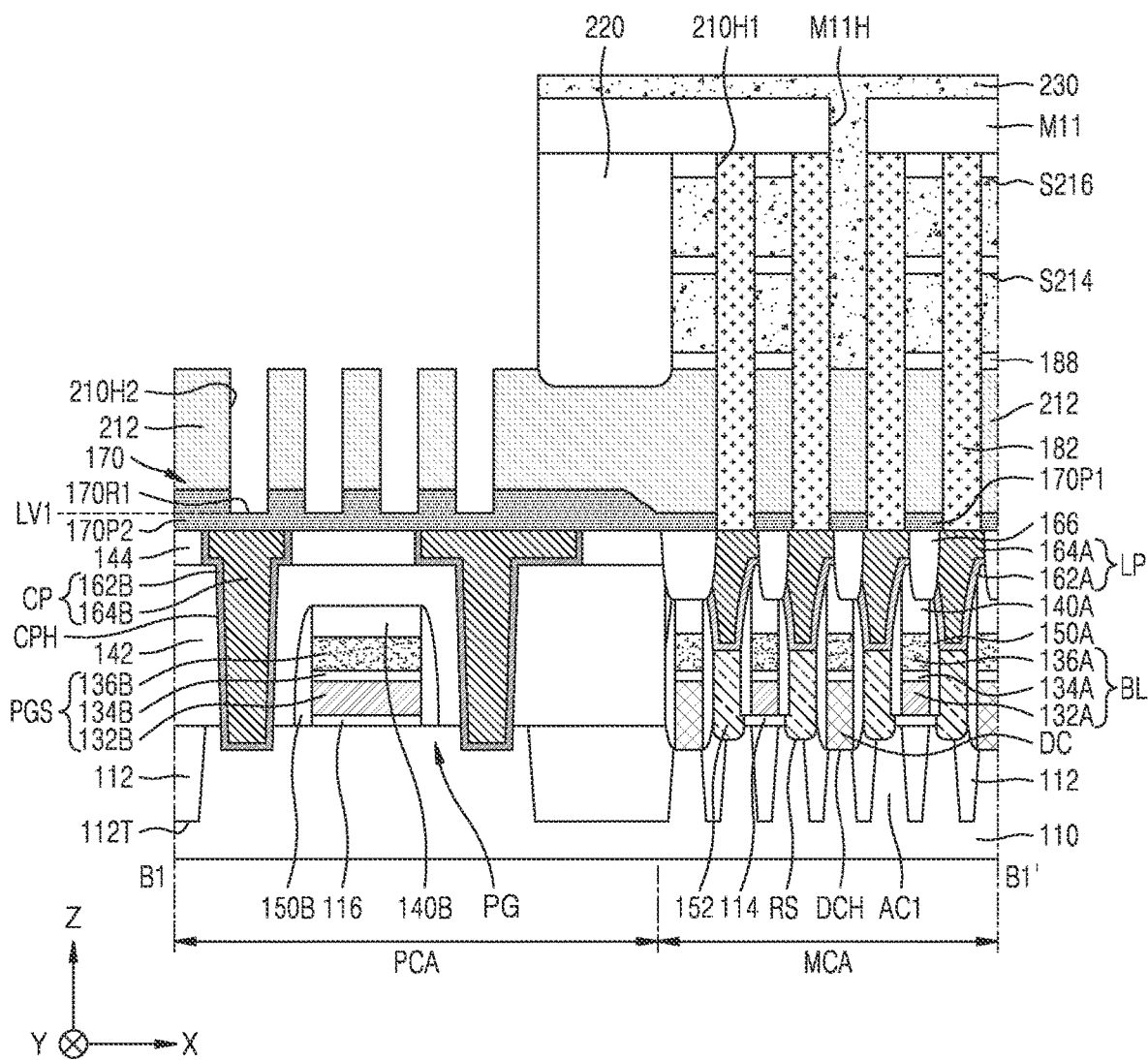

Referring to FIG. 20, the second openings 210H2 and the recesses 170R1 arranged under the second openings 210H2 may be exposed by removing the dummy lower electrode 182D (see FIG. 19).

In a process of removing the dummy lower electrode 182D, the lower electrode 182 in the cell array area MCA may not be removed.

Figure 21:
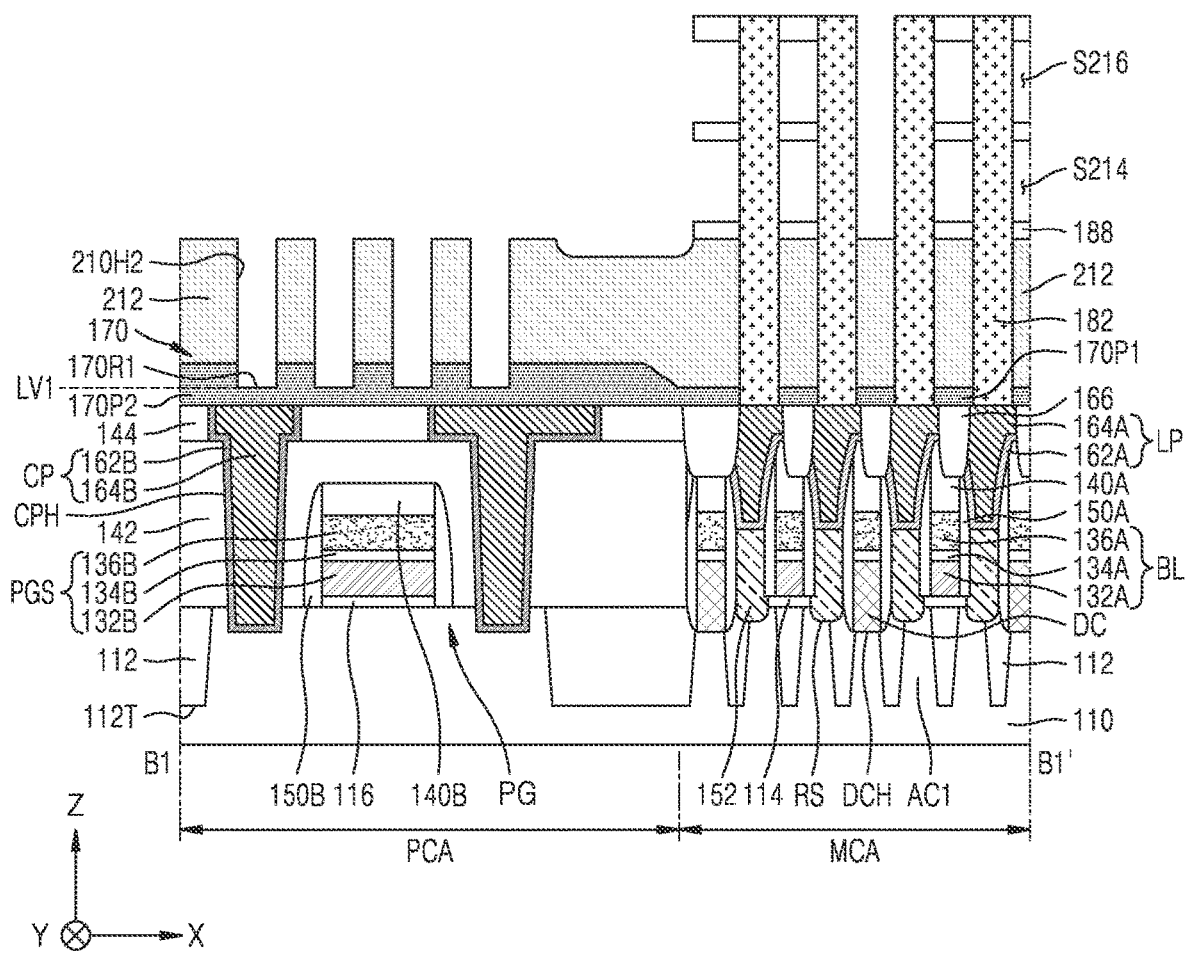

Referring to FIG. 21, the protective layer 230, the cover mask pattern M11, and the dam structure 220 may be removed. Accordingly, the first mold layer 212, the lower electrode 182, and the support layer 188 may remain.

Figure 22:
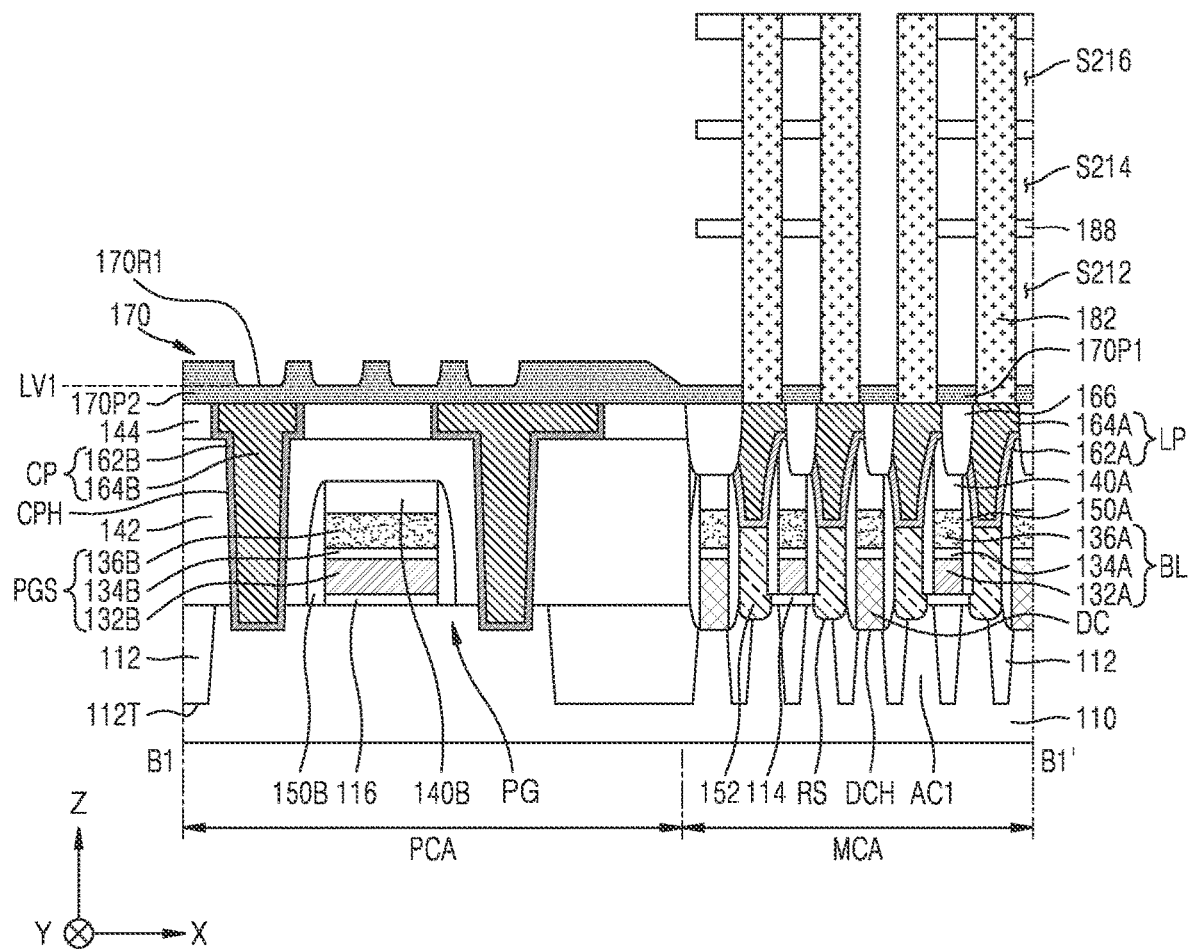

Referring to FIG. 22, the first mold layer 212 (see FIG. 21) may be removed through the opening M11H, and a first mold space S212 may be formed in an area where the first mold layer 212 is removed. Lower sidewalls of the lower electrode 182 and the etching stop layer 170 may be exposed through the first mold space S212.

In some embodiments, the upper portions of the recesses 170R1 formed on the second portion 170P2 of the etching stop layer 170 may be exposed to an etching atmosphere while the first mold layer 212 is removed, and thus, the upper portions of the recesses 170R1 may extend in a lateral direction to have a greater width than lower portions of the recesses 170R1.

Figure 23:
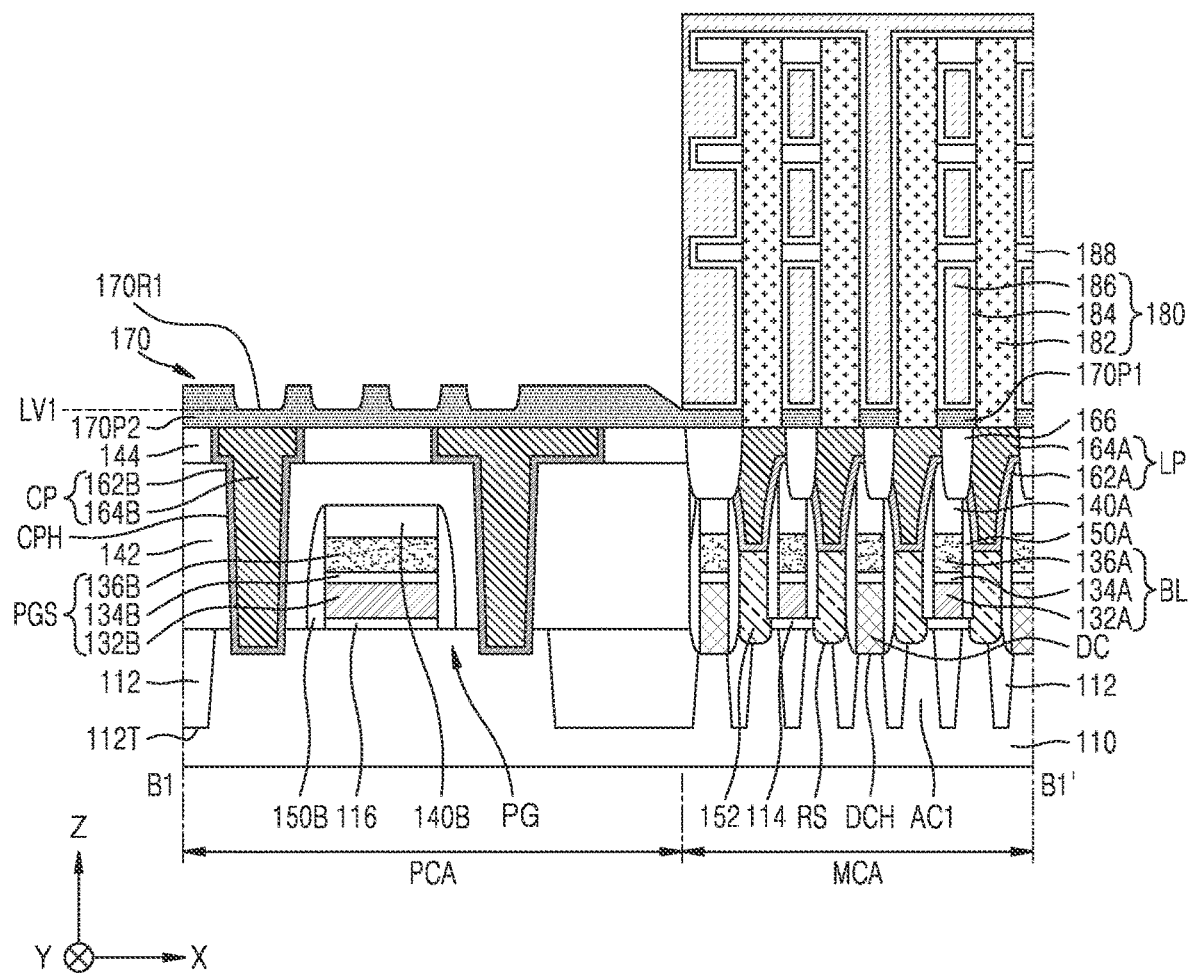

Referring to FIG. 23, the capacitor dielectric layer 184 and the upper electrode 186 may be sequentially formed on the lower electrode 182 and the support layer 188, thus forming the capacitor structure 180.

Figure 24:
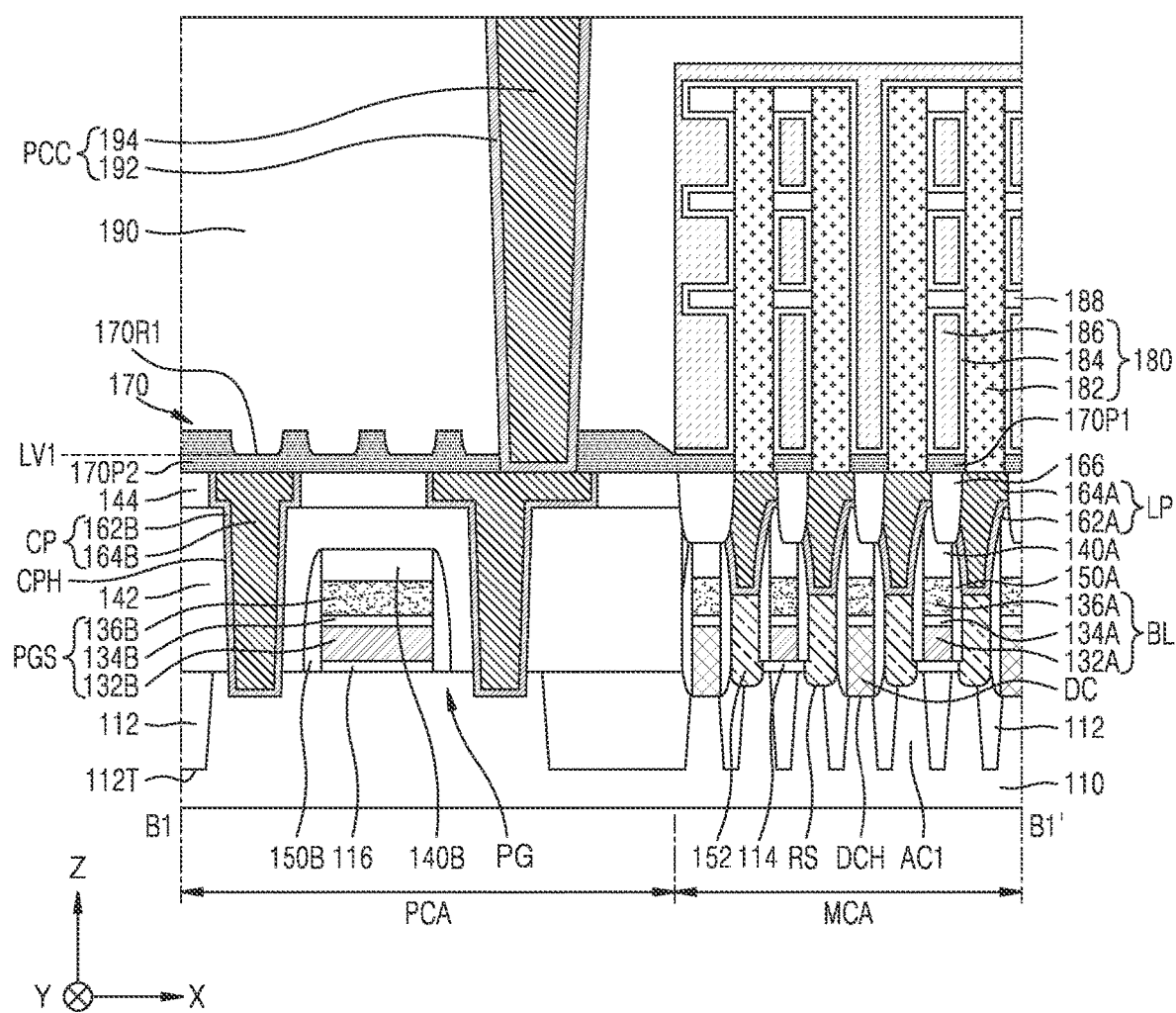

Referring to FIG. 24, the interlayer insulating layer 190 may be formed on the capacitor structure 180 and the etching stop layer 170.

Then, a peripheral circuit contact hole (not shown) penetrating the interlayer insulating layer 190 may be formed, and the peripheral circuit contact PCC may be formed in the peripheral circuit contact hole.

In the foregoing manner, the semiconductor device 100 may be substantially manufactured according to embodiments of the inventive concept. Of note in this regard, the dummy lower electrode 182D may be formed in the peripheral circuit area PCA, and warpage that may result from the application of stress to the substrate 110 may be inhibited or prevented. Accordingly, the formation of defects (e.g., bridge defects) between the lower electrodes 182 may be prevented.

Figure 25:
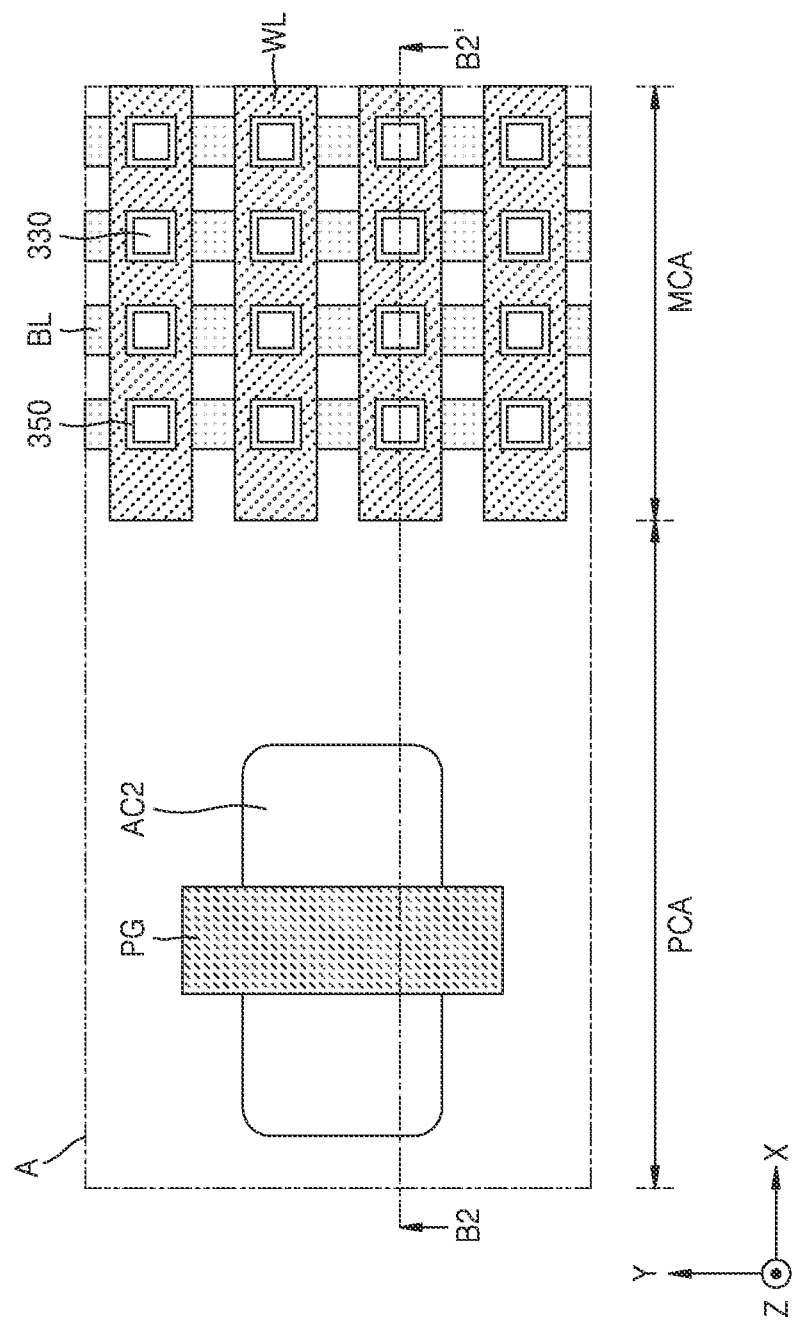
FIG. 25 is a plan diagram illustrating a semiconductor device 300 according to embodiments of the inventive concept.
Figure 26:
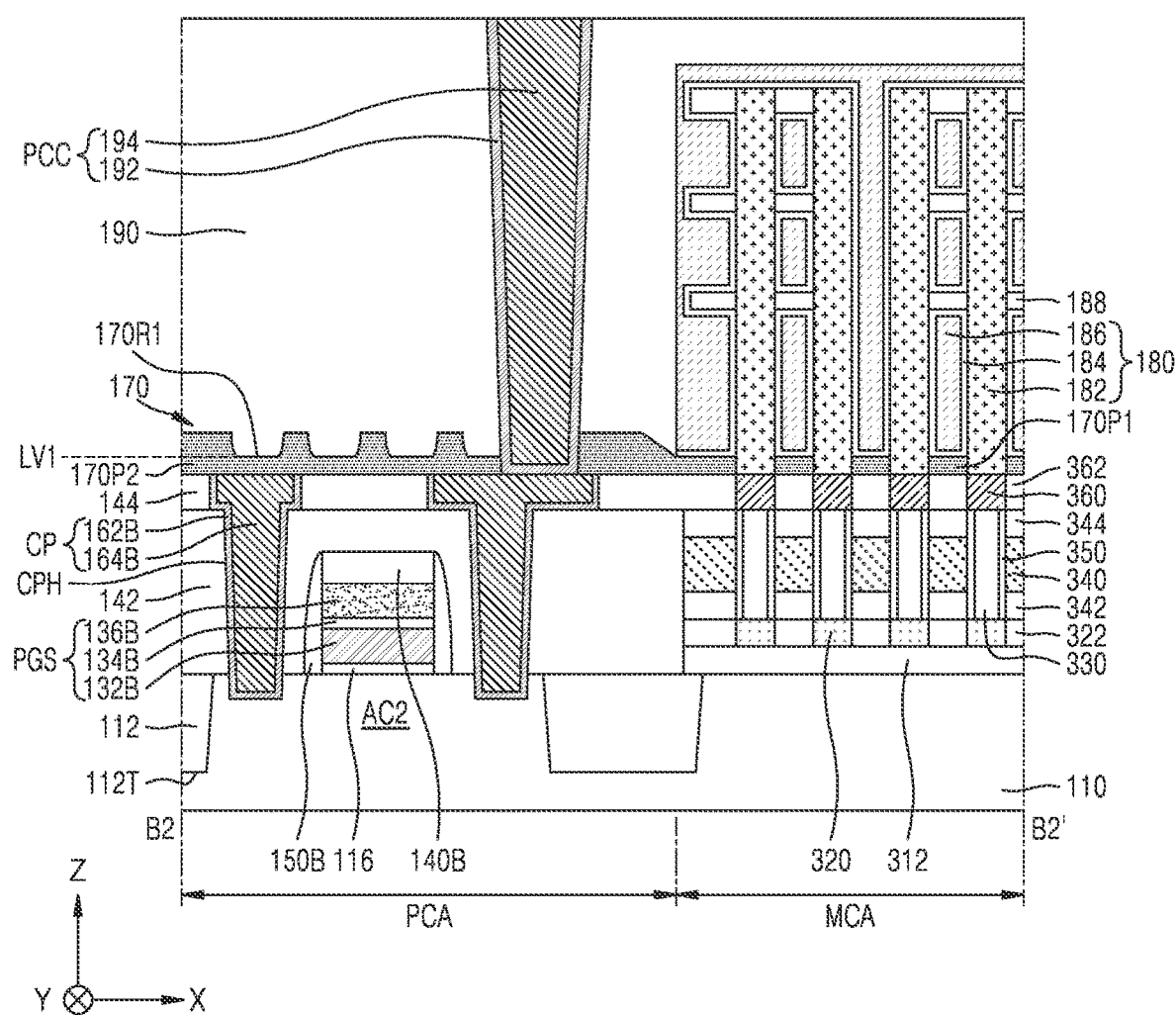
FIG. 26 is a cross-sectional view taken along a line B2-B2' of FIG. 25.

FIG. 25 is a plan view illustrating a semiconductor device 300 according to embodiments of the inventive concept, and FIG. 26 is a cross-sectional view taken along line B2-B2' of the semiconductor device 300 of FIG. 25.

Referring to FIGS. 25 and 26, the semiconductor device 300 may include first conductive lines 320, channel layers 330, a gate electrode 340, gate insulating layers 350, and the capacitor structure 180 in the cell array area MCA of the substrate 110. The semiconductor device 300 may be a memory device including a vertical channel transistor (VCT), and the VCT may indicate a structure in which a channel length of the channel layer 330 extends from the substrate 110 in a vertical direction.

A lower insulating layer 312 may be arranged on the substrate 110. On the lower insulating layer 312, the first conductive lines 320 may be apart from each other in the first horizontal direction and extend in the second horizontal direction. On the lower insulating layer 312, first insulating patterns 322 may be arranged to fill gaps between the first conductive lines 320. The first conductive lines 320 may correspond to the bit lines BL of the semiconductor device 300.

In some embodiments, the first conductive lines 320 may include doped polysilicon, metal, conductive metal nitride, conductive metal silicide, conductive metal oxide, or a combination thereof. For example, the first conductive lines 320 may include doped polysilicon, aluminum (Al), copper (Cu), Ti, Ta, Ru, W, Mo, Pt, Ni, cobalt (Co), TiN, TaN, WN, NbN, TiAl, TiAlN, TiSi, TiSiN, TaSi, TaSiN, RuTiN, NiSi, CoSi, $IrO_x$, $RuO_x$, or a combination thereof, but one or more embodiments are not limited thereto. The first conductive lines 320 may each be a layer or layers including the above materials. In some embodiments, the first conductive lines 320 may include two-dimensional semiconductor materials. Examples of two-dimensional semiconductor materials include graphene and carbon nanotubes.

The channel layers 330 may be arranged in an island form and thus apart from each other on the first conductive lines 320 in the first horizontal direction and the second horizontal direction. The channel layer 330 may have a first width in the first horizontal direction and a first height in the vertical direction, and the first height may be greater than the first width. For example, the first height may be about two to ten times the first width, but is not limited thereto. A lower portion of the channel layer 330 may function as a first source/drain area (not shown), an upper portion of the channel layer 330 may function as a second source/drain area (not shown), and portions of the channel layer 330 between the first and second source/drain areas may function as channel areas (not shown).

In some embodiments, the channel layer 330 may include an oxide semiconductor, and examples of an oxide semiconductor include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The channel layer 330 may be a layer or layers including the oxide semiconductor. In some embodiments, the channel layer 330 may have greater bandgap energy than silicon. For example, the bandgap energy of the channel layer 330 may range from between about 1.5 eV and about 5.6 eV. For example, the channel layer 330 may have optimum channel performance when the bandgap energy of the channel layer 330 ranges from between about 2.0 eV and about 4.0 eV. For example, the channel layer 330 may be polycrystalline or amorphous, but is not limited thereto. In some embodiments, the channel layer 330 may include a two-dimensional semiconductor material, and examples of a two-dimensional semiconductor material include graphene, carbon nanotubes, and a combination thereof.

The gate electrode 340 may surround sidewalls of the channel layer 330 and extend in the first horizontal direction. In a plan view, the gate electrode 340 may be a gate all-around type gate electrode surrounding the entire sidewalls of the channel layer 330 (e.g., four sidewalls). The gate electrode 340 may correspond to the word line WL of the semiconductor device 300.

In other embodiments, the gate electrode 340 may be of a dual gate type, and for example, the gate electrode 340 may include a first sub-gate electrode (not shown) facing a first sidewall of the channel layer 330 and a second sub-gate electrode (not shown) facing a second sidewall of the channel layer 330 that is opposite to the first sidewall. In other embodiments, the gate electrode 340 may be of a single gate type that only covers the first sidewall of the channel layer 330 and extends in the first horizontal direction.

The gate electrode 340 may include doped polysilicon, metal, conductive metal nitride, conductive metal silicide, conductive metal oxide, or a combination thereof. For example, the gate electrode 340 may include polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but one or more embodiments are not limited thereto.

The gate insulating layer 350 may surround the sidewalls of the channel layer 330 and may be arranged between the channel layer 330 and the gate electrode 340. In some embodiments, the gate insulating layer 350 may include a silicon oxide layer, a silicon oxynitride layer, or a high-k dielectric film having a dielectric constant greater than the silicon oxide layer. The high-k dielectric film may include metal oxide or metal oxynitride. For example, the high-k dielectric film used as the gate insulating layer 350 may include $HfO_2$, HfSiO, HfSiON, HfaO, HfSiO, HfZrO, $ZrO_2$, $Al_2O_3$, or a combination thereof, but one or more embodiments are not limited thereto.

A first buried insulating layer 342 surrounding lower sidewalls of the channel layer 330 may be arranged on the first insulating pattern 322, and a second buried insulating layer 344, which surrounds upper sidewalls of the channel layer 330 and covers the gate electrode 340, may be arranged on the first buried insulating layer 342.

Capacitor contacts 360 may be arranged on the channel layers 330. The capacitor contacts 360 may overlap the channel layers 330 and may be spaced apart (e.g., in a matrix) in the first horizontal direction and/or the second horizontal direction. The capacitor contact 360 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but one or more embodiments are not limited thereto. An upper insulating layer 362 may surround sidewalls of the capacitor contact 360 on the second buried insulating layer 344.

The etching stop layer 170 may be arranged on the upper insulating layer 362, and the capacitor structure 180 may be arranged on the etching stop layer 170.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a substrate including a cell area and a peripheral circuit area, wherein the cell area includes cell transistors and the peripheral circuit area includes a peripheral circuit;
   an etching stop layer including a first portion of the etching stop layer arranged in the cell area and a second portion of the etching stop layer arranged in the peripheral circuit area; and
   a capacitor structure arranged in the cell area and including lower electrodes respectively connected to the cell transistors via the first portion of the etching stop layer and arranged according to a first pitch,
   wherein the second portion of the etching stop layer includes recesses arranged according to a second pitch substantially the same as the first pitch,
   wherein the etching stop layer comprises a first thickness at each recess and a second thickness between adjacent recesses, and
   wherein the second thickness is greater than the first thickness.

2. The semiconductor device of claim 1, wherein the recesses are arranged in a hexagonal pattern,
   the lower electrodes are arranged in a hexagonal pattern,
   the first pitch is a distance in a first horizontal direction between centers of two adjacent lower electrodes, and
   the second pitch is a distance in the first horizontal direction between centers of two adjacent recesses.

3. The semiconductor device of claim 1,
   wherein a bottom portion of each of the lower electrodes has a first width, and
   wherein each of the recesses has a second width that ranges from between about 100% to about 150% of the first width.

4. The semiconductor device of claim 1, wherein the recesses are defined in an upper surface of the second portion of the etching stop layer, and a lower surface of the second portion of the etching stop layer is flat.

5. The semiconductor device of claim 1, further comprising:
   an interlayer insulating layer on the second portion of the etching stop layer; and
   a peripheral circuit contact penetrating the interlayer insulating layer and the second portion of the etching stop layer to electrically connect to the peripheral circuit.

6. The semiconductor device of claim 5, wherein a lower surface of the interlayer insulating layer includes protrusions conforming to the recesses.

7. The semiconductor device of claim 1, wherein the recesses are arranged in a matrix, and the lower electrodes are arranged in a matrix.

8. The semiconductor device of claim 1, further comprising:
   a buffer insulating layer on the second portion of the etching stop layer; and
   an interlayer insulating layer on the buffer insulating layer,
   wherein the buffer insulating layer includes openings respectively corresponding to the recesses.

9. The semiconductor device of claim 8, wherein inner walls of the recesses and inner walls of the openings are respectively and continuously connected.

10. The semiconductor device of claim 8, wherein the openings are arranged in a hexagonal pattern.

11. The semiconductor device of claim 1, wherein the capacitor structure further includes:
    a capacitor dielectric layer covering upper surfaces of the lower electrodes and extending onto the first portion of the etching stop layer; and
    an upper electrode covering the lower electrodes on the capacitor dielectric layer.

12. A semiconductor device comprising:
    cell transistors on a substrate;
    lower electrodes respectively connected to the cell transistors, arranged according to a first pitch in a first horizontal direction, and extending in a vertical direction; and
    an etching stop layer surrounding lower sidewalls of the lower electrodes and arranged at a level higher than a level of the cell transistors, wherein the etching stop layer includes a first portion vertically overlapping the lower electrodes and a second portion laterally surrounding the first portion, and the second portion includes recesses arranged according to a second pitch in the first horizontal direction,
    wherein the etching stop layer comprises a first thickness at each recess and a second thickness between adjacent recesses, and
    wherein the second thickness is greater than the first thickness.

13. The semiconductor device of claim 12, wherein the recesses are arranged in a hexagonal pattern, and the lower electrodes are arranged in a hexagonal pattern.

14. The semiconductor device of claim 12, further comprising:
    an interlayer insulating layer on the second portion of the etching stop layer; and
    a peripheral circuit contact penetrating the interlayer insulating layer and the second portion of the etching stop layer.

15. The semiconductor device of claim 14, wherein a lower surface of the second portion of the etching stop layer is flat, and
    a lower surface of the interlayer insulating layer includes protrusions conforming to the recesses.

16. The semiconductor device of claim 12, further comprising:

a buffer insulating layer on the second portion of the etching stop layer; and an interlayer insulating layer on the buffer insulating layer, wherein the buffer insulating layer includes openings at locations respectively corresponding to the recesses.

17. The semiconductor device of claim 12, wherein bottom portions of each of the lower electrodes has a first width, and wherein each of the recesses has a second width that ranges from between about 100% to about 150% of the first width.

18. A semiconductor device comprising:

a substrate including a cell area and a peripheral circuit area, wherein the cell area includes cell transistors and the peripheral circuit area includes a peripheral circuit;

an etching stop layer including a first portion of the etching stop layer in the cell area and a second portion of the etching stop layer in the peripheral circuit area;

a capacitor structure in the cell area, wherein the capacitor structure includes lower electrodes, a capacitor dielectric layer covering upper surfaces of the lower electrodes, and an upper electrode on the capacitor dielectric layer and covering the lower electrodes, wherein the lower electrodes are respectively connected to the cell transistors via the first portion of the etching stop layer and are arranged according to a first pitch in a first horizontal direction;

an interlayer insulating layer on the second portion of the etching stop layer; and a peripheral circuit contact penetrating the interlayer insulating layer and the second portion of the etching stop layer to electrically connect to the peripheral circuit, wherein the second portion of the etching stop layer includes recesses arranged according to a second pitch in the first horizontal direction, wherein the etching stop layer comprises a first thickness at each recess and a second thickness between adjacent recesses, and wherein the second thickness is greater than the first thickness.

19. The semiconductor device of claim 1, wherein the first thickness and the second thickness extend in a vertical direction from an upper surface of the substrate.

20. The semiconductor device of claim 12, wherein the first thickness and the second thickness extend in a vertical direction from an upper surface of the substrate.

* * * * *